(12) United States Patent
Okada et al.

(10) Patent No.: US 6,678,870 B2
(45) Date of Patent: Jan. 13, 2004

(54) LOGICAL CIRCUIT DELAY OPTIMIZATION SYSTEM

(75) Inventors: Yumi Okada, Yokohama (JP); Rimi Mizuno, Kawasaki (JP); Eiji Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 09/986,916

(22) Filed: Nov. 13, 2001

(65) Prior Publication Data

US 2003/0051220 A1 Mar. 13, 2003

(30) Foreign Application Priority Data

Jun. 22, 2001 (JP) .......................................... 2001-189533

(51) Int. Cl.[7] .............................................. G06F 17/50
(52) U.S. Cl. ........................ 716/6; 716/1; 716/2; 716/5; 716/18
(58) Field of Search ............................. 716/6, 2, 10, 3, 716/9, 1–5, 7–18

(56) References Cited

U.S. PATENT DOCUMENTS

| | | | | |
|---|---|---|---|---|
| 5,274,568 A | * | 12/1993 | Blinne et al. ................... | 716/6 |
| 5,721,690 A | * | 2/1998 | Asaka ........................... | 716/18 |
| 5,724,250 A | * | 3/1998 | Kerzman et al. ............... | 716/3 |
| 5,737,237 A | * | 4/1998 | Tanaka et al. ................. | 716/9 |
| 5,883,808 A | * | 3/1999 | Kawarabayashi ............... | 716/2 |
| 5,956,257 A | * | 9/1999 | Ginetti et al. .................. | 716/3 |
| 6,009,248 A | * | 12/1999 | Sato et al. ...................... | 716/2 |
| 6,202,193 B1 | * | 3/2001 | Emura et al. .................. | 716/10 |
| 6,272,668 B1 | * | 8/2001 | Teene ............................ | 716/10 |
| 6,457,166 B1 | * | 9/2002 | Shoyama ....................... | 716/18 |
| 2001/0010090 A1 | * | 7/2001 | Boyle et al. .................... | 716/2 |
| 2001/0049814 A1 | * | 12/2001 | Matsumoto et al. ........... | 716/10 |
| 2002/0124230 A1 | * | 9/2002 | Cai et al. ........................ | 716/6 |

FOREIGN PATENT DOCUMENTS

| | | |
|---|---|---|
| JP | A-5-151310 | 6/1993 |
| JP | A-11-120222 | 4/1999 |

* cited by examiner

*Primary Examiner*—Vuthe Siek
*Assistant Examiner*—Magid Y. Dimyan
(74) *Attorney, Agent, or Firm*—Staas & Halsey LLP

(57) ABSTRACT

A logical circuit is configured by connecting a plurality of circuit blocks. A driving ability value computation unit computes a driving ability value required for a target circuit block based on a delay rate of the circuit block indicating a rate of delay of a signal traveling in the circuit block by a load capacity value provided by the circuit block, a driving ability value of a prior stage circuit block prior to the target circuit block, and a load capacity value provided for the target circuit block. A change unit changes the specification of the device used in the target circuit block based on the driving ability value obtained by the driving ability value computation unit.

27 Claims, 25 Drawing Sheets

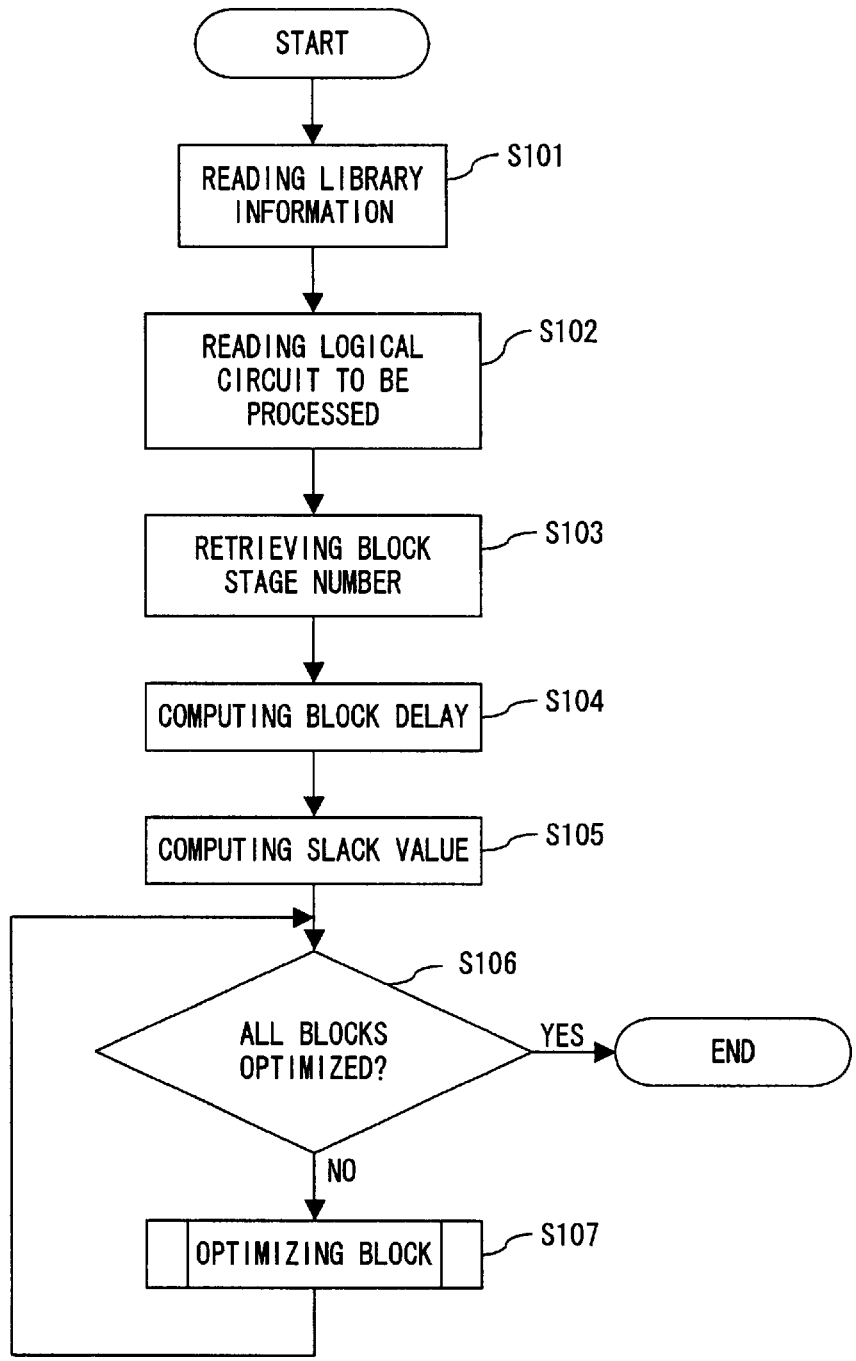
F I G. 3

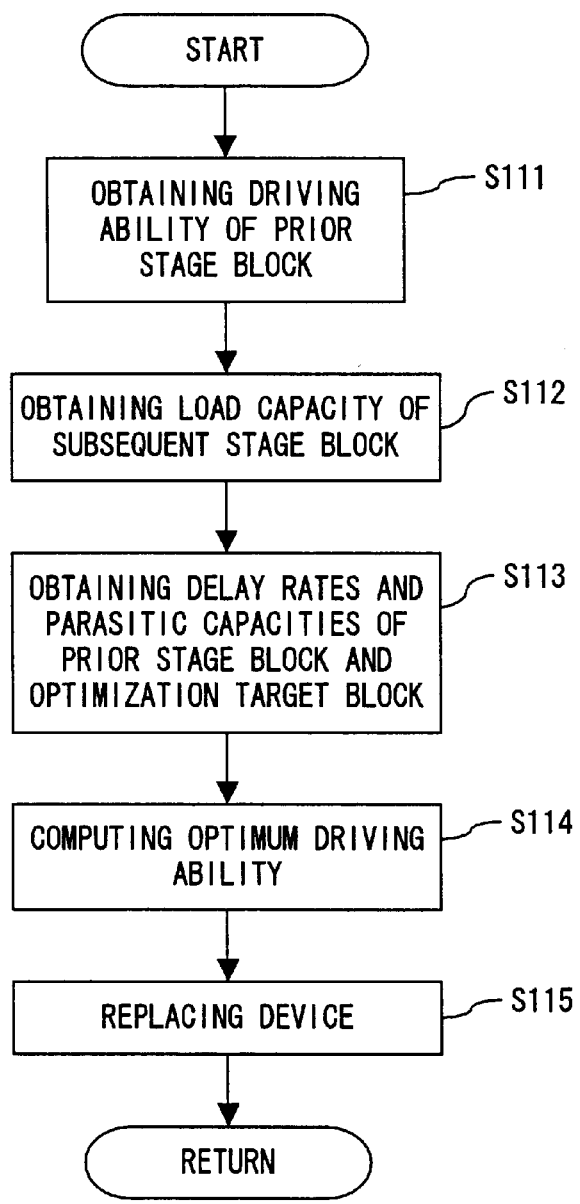
F I G. 4

```
DEVICE NAME   AAA {
        GROUP         : 2 NAND ;
        OPTIMIZATION  : POSSIBLE ;
        AREA          : 50 ;
        AVERAGE DELAY RATE: 1.3 ;
        AVERAGE DRIVING ABILITY: 32.75 ;
        AVERAGE PARASITIC CAPACITY: 9.75 ;
        NAME OF PIN   : A, B, X ;
        PIN A {
                DELAY RATE         : 1.2 ;
                DRIVING ABILITY    : 33.5 ;
                PARASITIC CAPACITY : 9.0 ;
        }
        PIN B {
                DELAY RATE         : 1.4 ;
                DRIVING ABILITY    : 32.0 ;
                PARASITIC CAPACITY : 10.5 ;
        }
}
DEVICE NAME   BBB {
        ...
        ...
        ...
}
...
```

F I G. 5

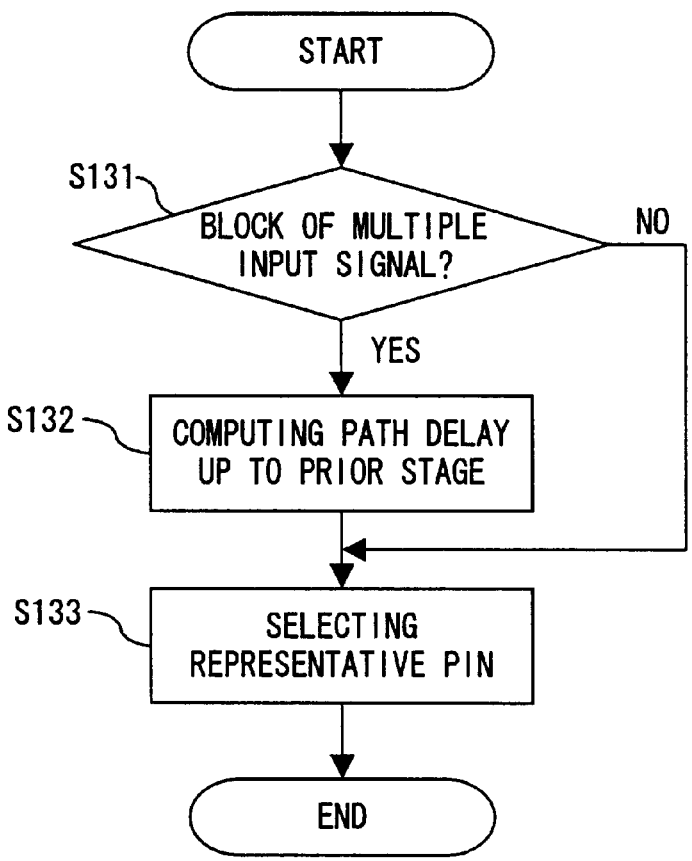
F I G. 1 3

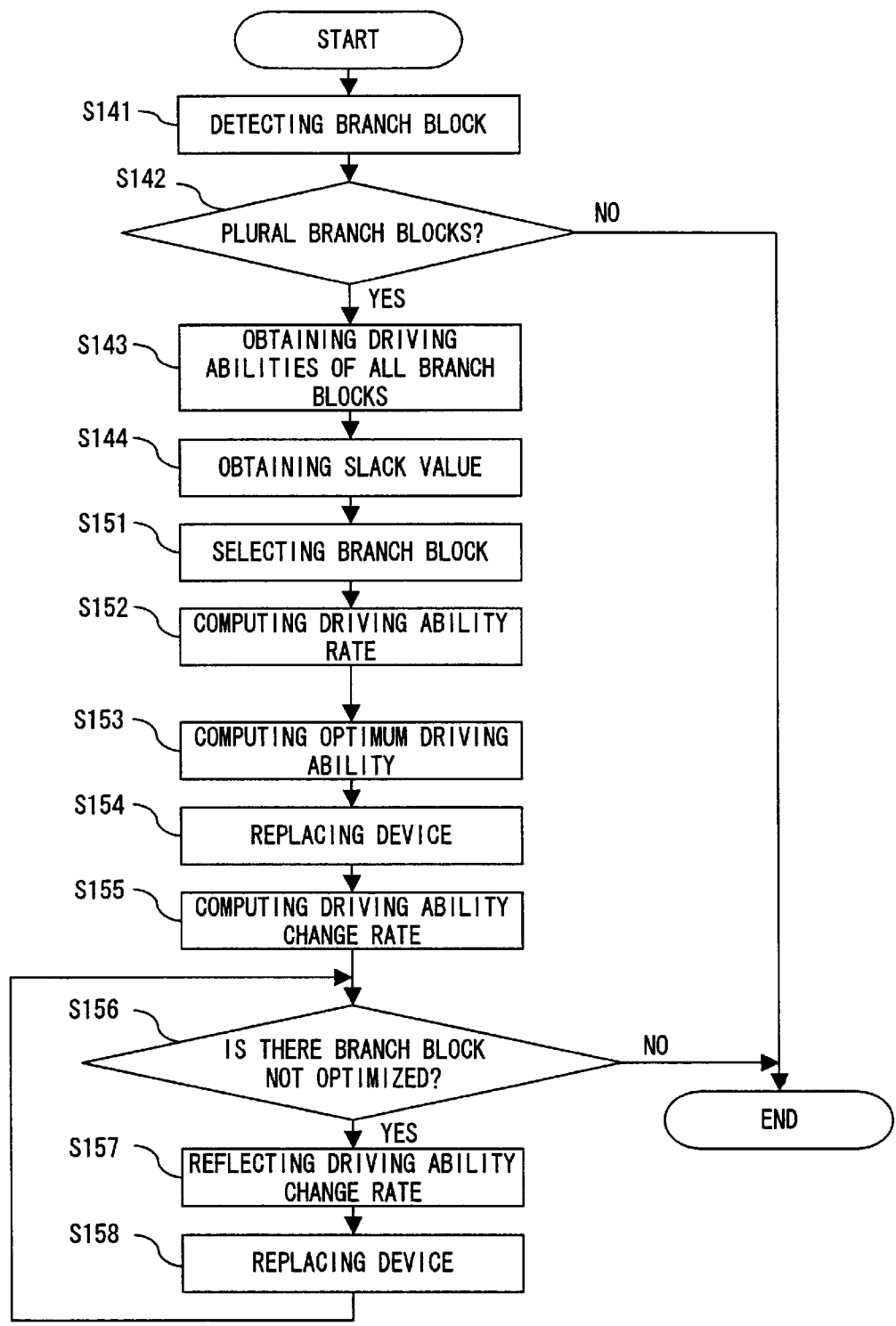
F I G. 1 7

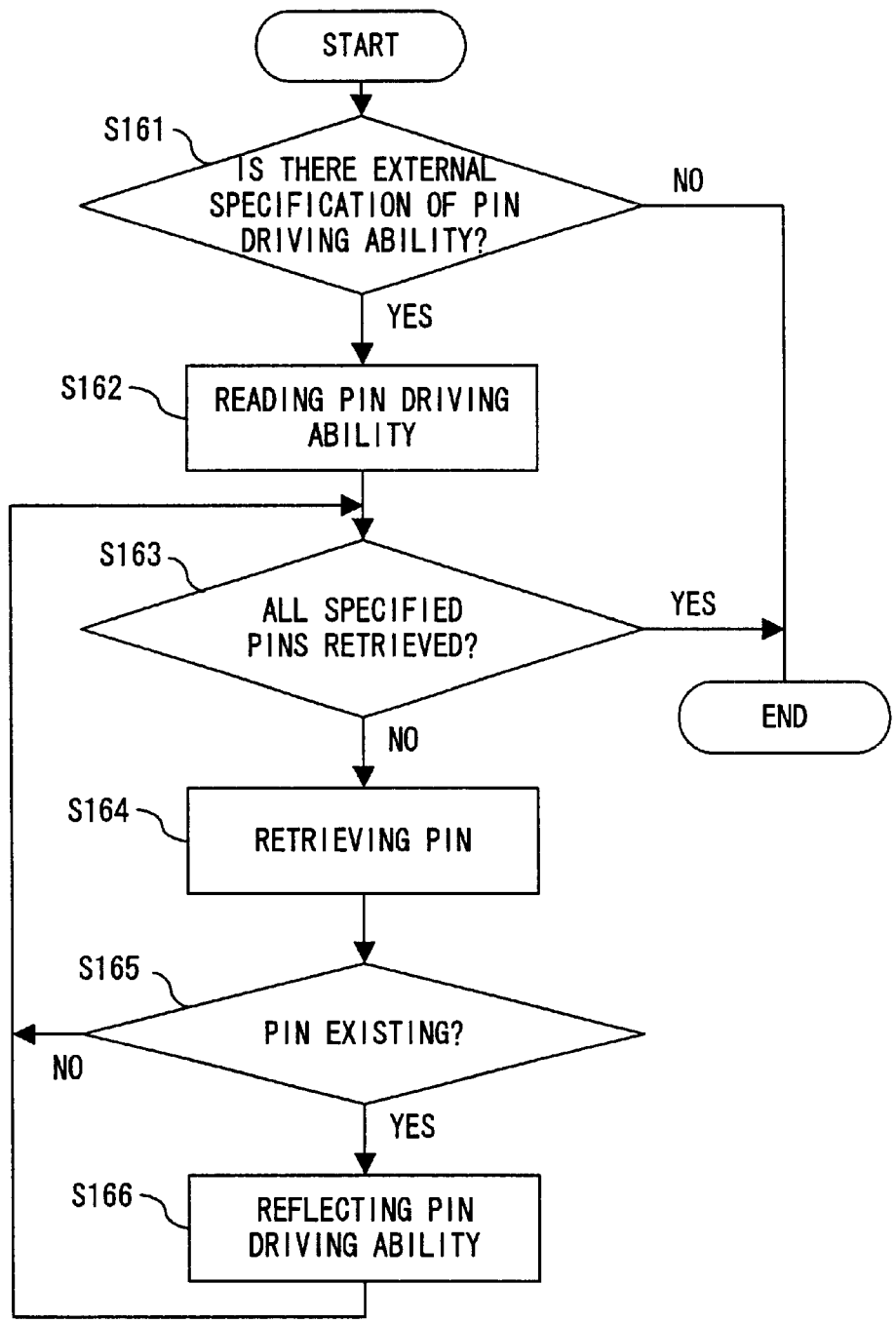
F I G. 18

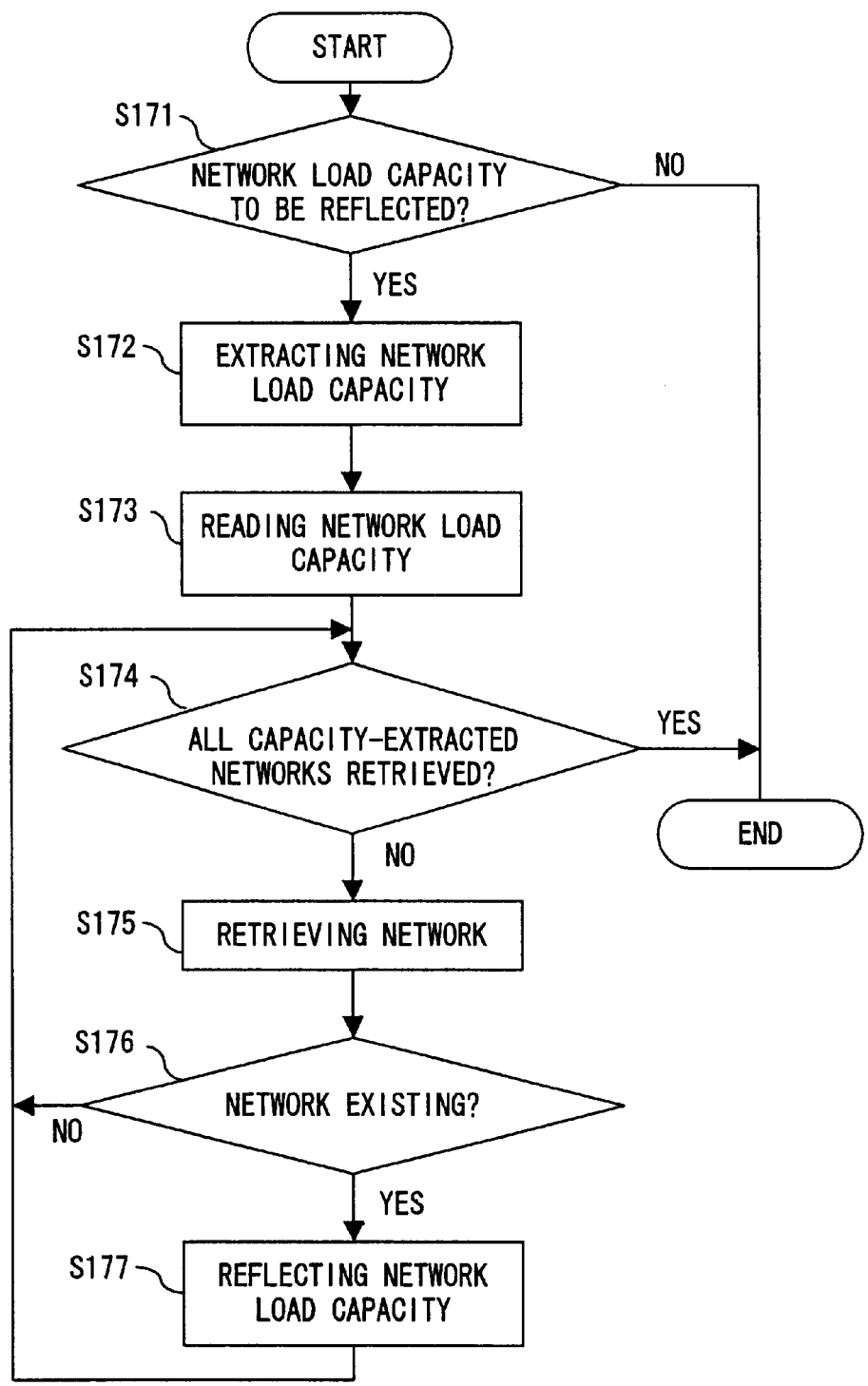
F I G. 1 9

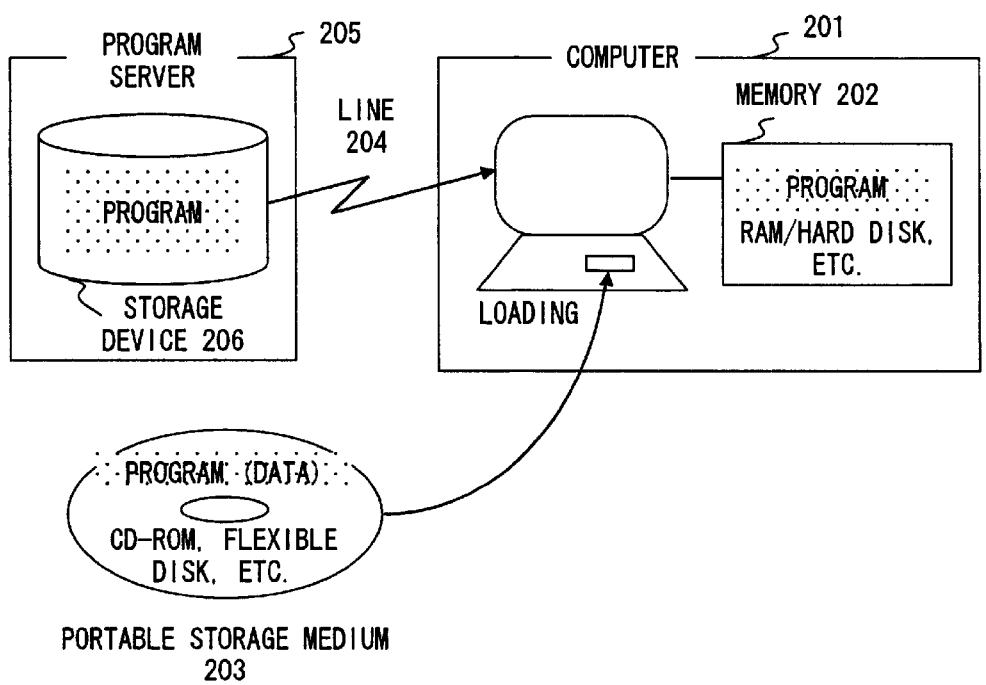
F I G. 2 3

LOGICAL CIRCUIT DELAY OPTIMIZATION SYSTEM

BACKGROUND OF THE INVENTION

1. Field of the Invention

The present invention relates to the technology of optimizing a logical circuit, and more specifically to the technology of optimizing the delay of a signal traveling in the logical circuit at the initial stage of designing the logical circuit.

2. Description of the Related Art

Conventionally, a number of suggestions of optimizing the delay of a critical path extracted from a logical circuit have been made as the technology of allowing a computer to optimize the delay which occurs in a logical circuit, that is, to optimize the delay of a signal traveling in the logical circuit, for example, Japanese Patent Publication No.5-151310, Japanese Patent Publication No.11-120222.

Since an enormous number of processes are required to extract a critical path by the above mentioned conventional technology, it is necessary to operate a high-performance computer for a long time.

In the conventional delay optimizing process performed by a computer, the optimizing process is performed only on fanouts on the critical path. That is, the relationship among a plurality of driven blocks configuring the fanouts has not been considered. Therefore, the driving ability (needed for a driven block with a view to driving the driven block) of the driven blocks in the critical path becomes too large, thereby possibly causing the installation circuit area of the driven blocks to be enlarged too much to reserve the driving ability.

Furthermore, in the conventional process, the external input/output terminal of a logical circuit to be designed, which is connected to another circuit, has been optimized by assuming that a common buffer device is connected to the external input/output terminal of other circuit. Additionally, the driving ability is fixed to a predetermined value for an input pin connected to the external input/output terminal in the logical circuit. To change the driving ability, the circuit containing the input pin has to be replaced with another circuit.

Furthermore, in the conventional process, the load capacity of a network (wiring connecting circuit blocks) does not reflect the information obtained by the installation design after performing a delay optimizing process. That is, it is not considered in an optimizing process, or an approximate value is used. Therefore, a circuit delay may not be successfully improved after the installation design although the circuit delay of a logical circuit is optimized.

Additionally, in the conventional process, it is necessary to issue an instruction for each device or a path to set a block not to be optimized at a user request not to perform a delay optimizing process, etc.

Furthermore, when a delay optimizing process is performed in the conventional process, a target circuit is automatically converted and output. Therefore, the logical circuits before and after the process have to be compared with each other to know the contents of the replacement of the devices by the optimization.

SUMMARY OF THE INVENTION

The present invention has been developed to solve the above mentioned problems, and aims at providing a new method for optimizing a circuit delay in a logical circuit.

The present invention works on the premises that an optimizing process is performed by a system or a method on a delay of a signal traveling in a logical circuit configured by connecting a plurality of circuit blocks by changing the specification about a primitive device specified for each circuit block for use in configuring the circuit blocks into the specification about another primitive device having the same function and a different driving ability value.

The logical circuit delay optimization system is an aspect of the present invention, and includes: a driving ability value computation unit for computing a driving ability value required for a target circuit block based on the delay rate of the circuit block indicating the rate of the delay of a signal traveling in the circuit block by the load capacity value provided for the circuit block, the driving ability value of a prior stage circuit block determined by the device specified for the prior stage circuit block connected at a stage prior to a target circuit block for which the specification is changed, and the load capacity value provided for the target circuit block by connecting another circuit block at a stage subsequent to the target circuit block; and a change unit for changing the specification of the device used in the target circuit block based on the driving ability value obtained in the computation.

According to the above mentioned aspect of the present invention, the optimum device to be used in a target circuit block can be selected based on the characteristic value of the circuit block connected at a stage prior to or subsequent to the target circuit block. As a result, the delay optimization can be realized for the logical circuit without extracting a critical path by selecting the optimum devices for all circuit blocks, thereby reducing the number of processes required for the delay optimization.

Another aspect of the logical circuit delay optimization system according to the present invention includes: a slack value computation unit for computing a slack value of a circuit block; a driving ability value distribution unit for distributing to each subsequent stage circuit block a driving ability value for each subsequent stage circuit block before changing the specification determined by a device specified as the subsequent stage circuit block when an output of a circuit block in a logical circuit is connected to one of a plurality of subsequent stage circuit blocks which are provided at the subsequent stages of the circuit block based on differences among the slack values computed for the subsequent stage circuit blocks with a sum of the driving ability values of the subsequent stage circuit blocks maintained; a subsequent stage circuit block driving ability value computation unit for computing a driving ability value required for the subsequent stage circuit block by assuming that the driving ability value distributed by the driving ability value distribution unit as a driving ability value of a circuit block provided at a stage prior to the subsequent stage circuit block; and a subsequent stage circuit block change unit for changing the specification of a device for use in the subsequent stage circuit block based on the driving ability value obtained in the computation.

According to the above mentioned aspect of the present invention, a larger driving ability value is assigned to a subsequent stage circuit block having a shorter timing value and a smaller driving ability value is assigned to a subsequent stage circuit block having a longer timing value according to the slack value of each circuit block, and the optimizing process can be performed with a signal path having a longer signal delay prioritized, thereby realizing delay optimization indicating well balanced driving abilities.

A further aspect of the logical circuit delay optimization system according to the present invention includes: a slack value computation unit for computing a slack value of a circuit block; a driving ability ratio computation unit for computing the ratio of the sum of the driving ability values of subsequent stage circuit blocks before changing the specification determined by a device specified for the subsequent stage circuit block to a driving ability value of a circuit block having a smaller timing value according to a slack value in the subsequent stage circuit blocks before changing the specification when an output of a circuit block in a logical circuit is connected to one of a plurality of subsequent stage circuit blocks which are provided at the subsequent stages of the circuit block; a driving ability value computation unit for computing a driving ability value required for the subsequent stage circuit block indicated as having the smallest timing value according to a slack value based on the rate of the driving ability value computed by the driving ability ratio computation unit; and a subsequent stage circuit block change unit for changing the specification of the subsequent stage circuit block indicated as having the smallest timing value according to a slack value based on the driving ability value obtained in the computation.

According to the above mentioned aspect of the present invention, when the specification of a device for a subsequent stage circuit block indicated as having the smallest timing value by a slack value when subsequent stage circuit blocks configure a plurality of fanouts is changed, the characteristic value of another subsequent stage circuit block simultaneously driven with the subsequent stage circuit block is considered. Therefore, the device can be appropriately selected.

As described above, a circuit delay in a logical circuit can be optimized according to any aspect of the present invention.

BRIEF DESCRIPTION OF THE DRAWINGS

The present invention will be more apparent from the following detailed description when the accompanying drawings are referenced.

FIG. 3 is a flowchart showing the contents of the circuit delay optimizing process;

FIG. 4 is a flowchart showing the contents of the first example of the block optimizing process;

FIG. 5 shows an example of a library in which device information is defined;

FIG. 13 is a flowchart of the contents of the representative pin selecting process;

FIG. 17 is a flowchart of the contents of the driving ability change rate reflecting process;

FIG. 18 is a flowchart of the contents of the driving ability specification detecting process;

FIG. 19 is a flowchart of the contents of the network load capacity specification reflecting process;

FIG. 23 shows an example of a storage medium from which a control program can be read by a computer.

DESCRIPTION OF THE PREFERRED EMBODIMENTS

Figure 1A:
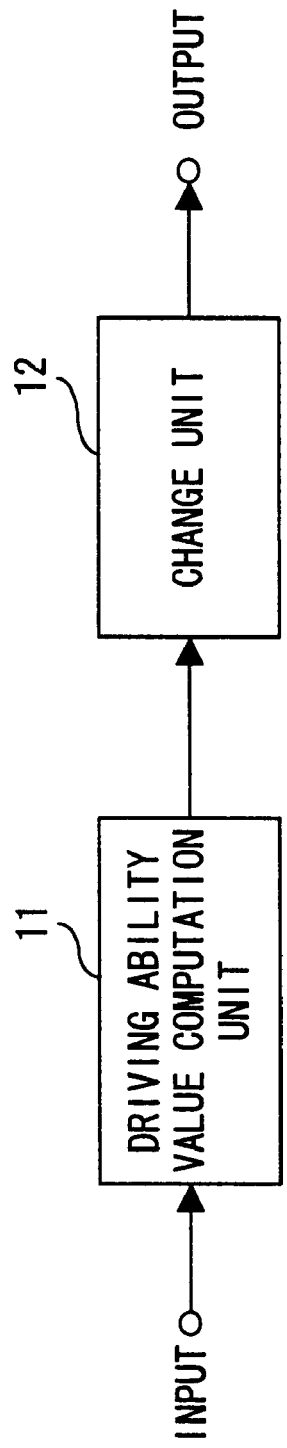
FIG. 1A shows the first configuration indicating the principle of the present invention.
Figure 1B:
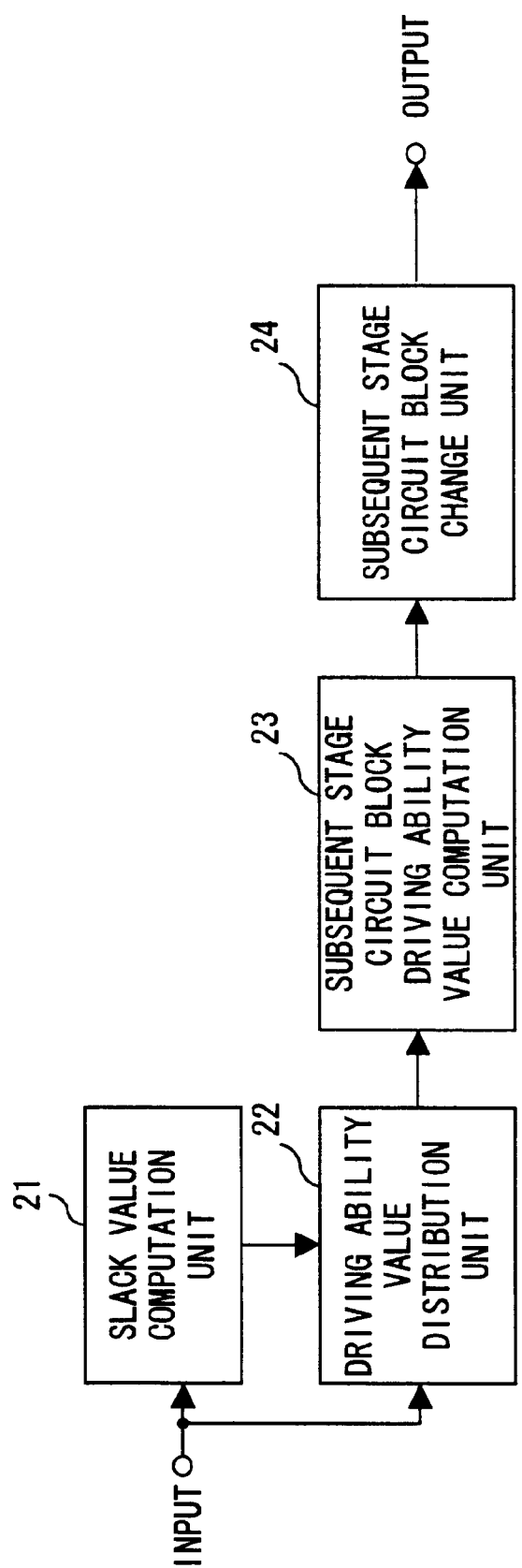
FIG. 1B shows the second configuration indicating the principle of the present invention.
Figure 1C:
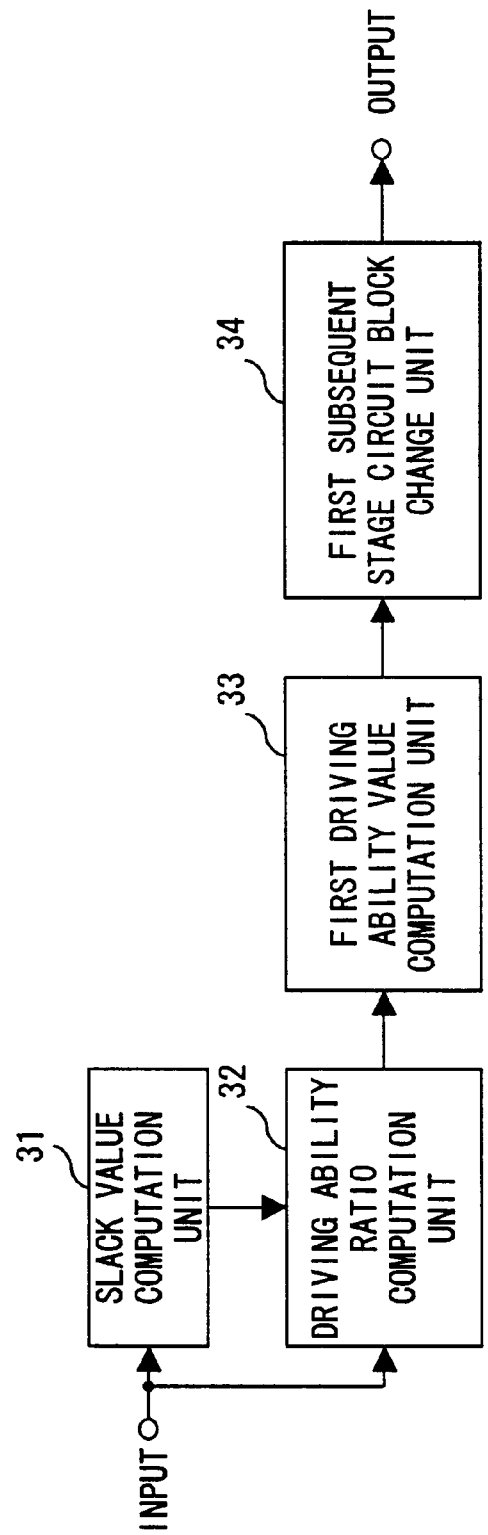
FIG. 1C shows the third configuration indicating the principle of the present invention.

FIGS. 1A, 1B, and 1C show the configurations of the principle of the present invention.

The present invention works on the premises that an optimizing process is performed by a logical circuit delay optimization system or a logical circuit delay optimization method on a delay of a signal traveling in a logical circuit configured by connecting a plurality of circuit blocks by changing the specification about a primitive device specified for each circuit block for use in configuring the circuit blocks into the specification about another primitive device having the same function and a different driving ability value.

A 'primitive device' refers to a device as a base for a logical circuit. Practically, it generally indicates a basic logical device, for example, various gates such as an inverter, buffer, AND, OR, NAND, NOR, etc., various flipflops such as an RS, JK, D, etc. A 'driving ability value' refers to the value of a level of the ability to drive a device when a signal is input, that is, a level of the ability to allow a load connected to an output terminal of the device to invert the logic indicated by an output signal of the device.

Described below is the first configuration shown in FIG. 1A. It shows the first configuration of the principle of the logical circuit delay optimization system according to the present invention.

A driving ability value computation unit 11 computes a driving ability value required for a target circuit block based on the delay rate of the circuit block indicating the rate of the delay of a signal traveling in the circuit block by the load capacity value provided for the circuit block, the driving ability value of a prior stage circuit block determined by the device specified for the prior stage circuit block connected at a stage prior to a target circuit block for which the specification is changed, and the load capacity value provided for the target circuit block by connecting another circuit block at a stage subsequent to the target circuit block.

A change unit 12 changes the specification of the device used in the target circuit block based on the driving ability value obtained by the driving ability value computation unit 11.

With the first configuration, the optimum device for use in a target circuit block can be selected based on the characteristic value about the circuit block connected at a stage prior to or subsequent to the target circuit block. Therefore, the delay optimization can be realized for the logical circuit without extracting a critical path by selecting the optimum devices for all circuit blocks, thereby reducing the number of processes required for the delay optimization.

With the above mentioned first configuration, the change unit 12 can be designed to make the change to select the device requiring the same installation circuit area as the device selected before the change.

With the configuration, it is possible to prevent the installation area of a logical circuit relating to the delay optimization from increasing.

Furthermore, the above mentioned first configuration can be designed to further include: a delay value computation unit for computing the delay value which can be generated by a signal input into the logical circuit or a signal output from a circuit block which is a flipflop in the logical circuit by the time it passes through and output from the circuit blocks for the target circuit block as a delay value at the prior stage circuit block; and a representative pin determination unit for determining an input pin, in a plurality of input pins for input of a signal into the target circuit block, having the largest delay value at the prior stage circuit block relating to the target circuit block as a representative pin, and the driving ability value computation unit 11 can perform the computation based on the driving ability value of the circuit block connected to the representative pin in the prior stage circuit block for the target circuit block.

With the configuration, the delay optimization can be performed on the circuit block having a plurality of input terminals.

The above mentioned first configuration can also be designed to further include an external device driving ability value input unit for inputting a driving ability value of a device connected to the external output terminal of the logical circuit, wherein the driving ability value computation unit 11 can compute the driving ability value required for the target circuit block connected to the external input terminal by assuming that the driving ability value input into the external device driving ability value input unit is the driving ability value of the prior stage circuit block.

With the configuration, the driving ability value of a device connected to an actually predicted external input terminal can be correctly reflected by the delay optimization of a logical circuit.

Furthermore, the above mentioned first configuration can also be designed to further comprise a prior stage circuit block driving ability value input unit for inputting a driving ability value of the prior stage circuit block such that the driving ability value computation unit 11 can compute the driving ability value required for the target circuit block by assuming that the driving ability value input into the prior stage circuit block driving ability value input unit is the driving ability value of the prior stage circuit block.

With the configuration, although a design change can be predicted for the circuit configuration up to the prior stage circuit block, the subsequent stage circuit block can be optimized by priority if a provisional driving ability value of the prior stage circuit block is input.

The above mentioned first configuration can also be designed to further comprise an external device load capacity value input unit for inputting a load capacity value assigned to a logical circuit by the device connected to an external output terminal of the logical circuit such that the driving ability value computation unit 11 can compute the driving ability value required for the target circuit block connected to the external output terminal by assuming that the load capacity value input into the external device load capacity value input unit is the load capacity value assigned to the target circuit block.

With the above mentioned configuration, the load capacity by the device connected to the actually predicted external output terminal can be correctly reflected by the delay optimization of a logical circuit.

Furthermore, the above mentioned first configuration can also be designed to further comprise a wiring capacity obtaining unit for obtaining the wiring capacity generated by the wiring between the circuit blocks obtained by the installation design of the logical circuit such that the driving ability value computation unit 11 can compute the driving ability value required for the target circuit block based on both the wiring capacity obtained by the wiring capacity obtaining unit and the load capacity value.

With the configuration, the wiring capacity correctly obtained by the installation design can be reflected by the delay optimization of a logical circuit.

The above mentioned first configuration can also be designed to further comprise a non-optimization attribute assignment unit for assigning to the circuit block an attribute indicating that the specification is not changed such that the change unit 12 cannot change the specification of the target circuit block to which the attribute is assigned by the non-optimization attribute assignment unit.

With the configuration, the circuit block for which the user does not request a change can be set as a circuit block whose specification is not to be changed. Therefore, the number of processes required for the delay optimization can be reduced, and repetitive operations can be successfully reduced in designing a circuit.

The above mentioned first configuration can also be designed to further comprise a change contents output unit for outputting the contents of the change in the target circuit block whose specification has been changed by the change unit 12.

With the configuration, the result of the delay optimization can be reflected by the process in another system such as an installation design system, etc., thereby improving the design efficiency. Furthermore, the result is output into a file to clearly inform the user of the contents of the change. Accordingly, the operation efficiency can be improved in the operations for subsequent installation design, etc.

FIG. 1B shows the second configuration of the present invention. It actually shows the configuration based on the principle of the logical circuit delay optimization system according to the present invention.

A slack value computation unit 21 computes a slack value of a circuit block. A slack value of a circuit block refers to a difference between the longest delay generated up to the circuit block and the reaching time (allowable reaching time) allowed for the circuit block, and indicates the timing allowance level of the circuit block.

A driving ability value distribution unit 22 distributes to each subsequent stage circuit block a driving ability value for each subsequent stage circuit block before changing the specification determined by a device specified for the subsequent stage circuit block when an output of a circuit block in a logical circuit is connected to one of a plurality of subsequent stage circuit blocks which are provided at the subsequent stages of the circuit block based on differences among the slack values computed for the subsequent stage circuit blocks with a sum of the driving ability values of the subsequent stage circuit blocks maintained. 'When an output of a circuit block in a logical circuit is connected to one of a plurality of subsequent stage circuit blocks which are provided at the subsequent stages of the circuit block' refers to that the subsequent stage circuit block configures a plurality of fanouts for an output of the circuit block in the logical circuit.

A subsequent stage circuit block driving ability value computation unit 23 computes the driving ability value required for the subsequent stage circuit block by assuming that the driving ability value distributed by the driving ability value distribution unit 22 is the driving ability value of the circuit block at the prior stage of the subsequent stage circuit block.

A subsequent stage circuit block change unit 24 changes the specification of the device used in the subsequent stage circuit block based on the driving ability value obtained in the computation.

With the second configuration, the driving ability value distribution unit 22 assigns a larger driving ability value to a subsequent stage circuit block having a shorter timing value, and a smaller driving ability value to a subsequent stage circuit block having a longer timing value according to the slack value of each circuit block, thereby realizing the optimizing process with a signal path having a longer signal delay prioritized, and realizing the delay optimization indicating well balanced driving abilities.

The above mentioned second configuration can also be designed to further comprise a wiring capacity obtaining unit for obtaining the wiring capacity generated by the wiring between the circuit blocks obtained by the installation design of the logical circuit such that the subsequent stage circuit block driving ability value computation unit 23 can perform the computation based on the wiring capacity obtained by the wiring capacity obtaining unit.

With the configuration, the wiring capacity correctly obtained by the installation design can be reflected by the delay optimization of a logical circuit.

Described below is the third configuration shown in FIG. 1C. FIG. 1C shows the third configuration based on the principle of the logical circuit delay optimization system according to the present invention.

A slack value computation unit 31 computes the slack value of the circuit block.

A driving ability ratio computation unit 32 computes the ratio of the sum of the driving ability values for subsequent stage circuit blocks before changing the specification determined by a device specified for the subsequent stage circuit block to the driving ability value of a circuit block having the lowest timing allowance level by the slack value in the subsequent stage circuit blocks before changing the specification when an output of a circuit block in a logical circuit is connected to one of a plurality of subsequent stage circuit blocks which are provided at the subsequent stages of the circuit block.

A first driving ability value computation unit 33 computes the driving ability value required for the subsequent stage circuit block having the lowest timing allowance level by the slack value in the subsequent stage circuit blocks.

A first subsequent stage circuit block change unit 34 changes the specification for the subsequent stage circuit block having the lowest timing allowance level by the slack value in the subsequent stage circuit blocks according to the driving ability value obtained in the computation.

According to the third configuration, when the device specification is changed for the subsequent stage circuit block having the lowest timing allowance by the slack value when the subsequent stage circuit block configures a plurality of fanouts, the characteristic values for other subsequent stage circuit blocks driven simultaneously with the subsequent stage circuit block are considered, thereby approximately selecting the device.

The above mentioned third configuration can also be designed to further comprise: a change rate computation unit for computing the change rate of the driving ability values based on the driving ability value before the specification change of the circuit block having the lowest timing allowance level by the slack value in the subsequent stage circuit blocks, and the driving ability value of the device specified after the change by the first subsequent stage circuit block change unit; a second driving ability value computation unit for computing based on the change rate the driving ability value required for other subsequent stage circuit blocks excluding the circuit block having the lowest timing allowance level by the slack value in the subsequent stage circuit blocks; a second subsequent stage circuit block change unit for changing based on the driving ability value computed by the second driving ability value computation unit the specification for other subsequent stage circuit blocks excluding the circuit block having the lowest allowance level by the slack value in the subsequent stage circuit blocks.

With the configuration, when the subsequent stage circuit block configures a plurality of fanouts, a specification change is made for a device with the characteristic values of other simultaneously driven subsequent stage circuit blocks taken into account, thereby suppressing an excessive increase in circuit area.

Furthermore, the above mentioned third configuration can also be designed to further comprise a wiring capacity obtaining unit for obtaining a wiring capacity generated by the wiring between the circuit blocks obtained by the installation design of the logical circuit such that the first driving ability value computation unit 33 can compute the driving ability value required for the subsequent stage circuit block having the lowest timing allowance by the slack value in the subsequent stage circuit blocks based on the wiring capacity obtained by the wiring capacity obtaining unit.

With the configuration, the wiring capacity correctly obtained by the installation design can be reflected by the delay optimization of a logical circuit.

A program for directing a computer to perform the function realized by each element configuring the logical circuit delay optimization system according to the present invention can be generated, and the program can be executed by the computer to solve the above mentioned problems.

Figure 2:
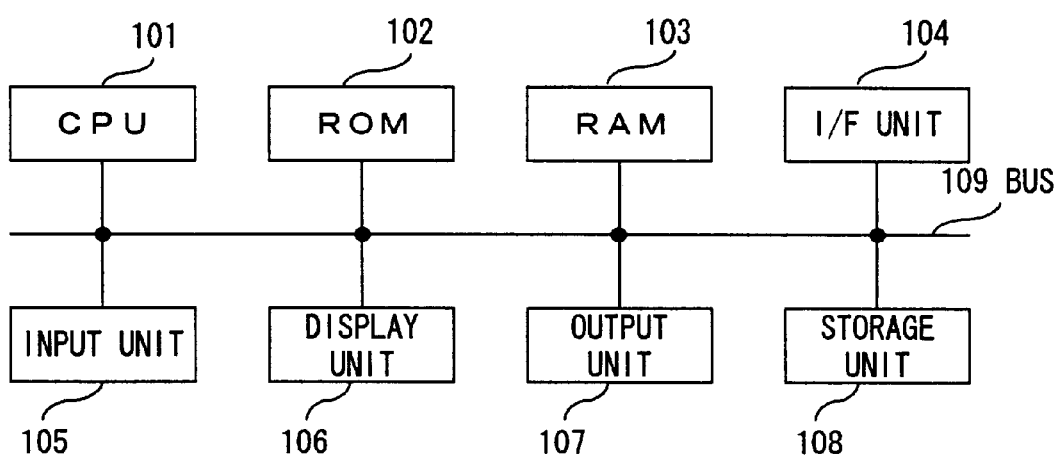
FIG. 2 shows the configuration of the logical circuit delay optimization apparatus embodying the present invention.

FIG. 2 shows the configuration of the logical circuit delay optimization system embodying the present invention. In FIG. 2, a CPU 101, ROM 102, RAM 103, an I/F unit 104, an input unit 105, a display unit 106, an output unit 107, and a storage unit 108 are interconnected through a bus 109 for mutual data communications.

The CPU (central processing unit) 101 controls the entire operation of the logical circuit delay optimization system (hereinafter referred to as a 'present apparatus').

The ROM (read only memory) 102 stores in advance a control program executed by the CPU 101. The entire operation of the present apparatus is controlled by the CPU 101 executing the control program.

The RAM (random access memory) 103 is used as necessary a temporary storage area of various data, or as work memory when the CPU 101 executes a control program stored in the ROM 102.

The I/F (interface) unit 104 controls the transmission/reception of various data to and from other devices through a communications network.

The input unit 105 receives input from an external unit, and transmits it to the CPU 101. For example, it is configured by an input device such as a keyboard, a mouse, etc. for receiving an instruction from a user of the present apparatus, or a reading device of a portable storage medium such as a FD (flexible disk), CD-ROM (compact disk ROM), DVD-ROM (digital versatile disk ROM), MO (magneto-optics) disk, etc.

The display unit 106 displays data at an instruction from the CPU 101, and is a display device comprising, for example, a CRT (cathode ray tube), an LCD (liquid crystal display).

The output unit 107 displays data at an instruction from the CPU 101, and is configured by, for example, a printer device, or a writing device of a portable storage medium such as the above mentioned FD, MD disk, etc. It is obvious that a device functioning as a writing and reading device can be shared between the input unit 105 and the output unit 107.

The storage unit 108 stores various data including a circuit block library described later, and is configured by, for example, a hard disk device, etc. Instead of executing a control program stored in the ROM 102, the CPU 101 can read a control program stored in a storage unit 17 in advance, temporarily store it in the RAM 103, read later the control program from the RAM 103, and execute it, thereby controlling the entire operations of the present apparatus.

The present apparatus is configured by the above mentioned components.

The configuration of the present apparatus shown in FIG. 2 is realized in a number of standard computers. Therefore, the present invention is embodied in these computers. Described below is the control process performed by the CPU 101 shown in FIG. 2. Each process described below is realized by the CPU 101 executing the control program for controlling the present apparatus.

First described is the process shown in FIG. 3. FIG. 3 is a flowchart showing the contents of the circuit delay optimizing process performed by the CPU 101.

First, in S101, the library of the circuit block stored in advance in the storage unit 108 is referred to, and each value of the device area, device attribute, same logical device group, driving ability of an input pin of a device, a parasitic capacity, and delay rate of each device defined as an available device to each circuit block is read and stored in a predetermined area of the RAM 103.

In the next S102, the circuit network information indicating the logical circuit to be processed in the delay optimizing process is input into the input unit 105 and obtained in the form of network information, and is stored in a predetermined area of the RAM 103.

In S103, in the logical circuit, a circuit block whose input pin is directly connected to an external input terminal, and a circuit block which is a flipflop (a circuit block is hereinafter also referred to simply as a 'block') are defined as the first stage. Thus, the stage of each block is detected.

In S104, in the logical circuit, the longest delay from an external input terminal or a clock pin of a flipflop to each block is computed based on the stage detected in S103.

In S105, the allowable reaching time from each block in the logical circuit to the external output terminal in the logical circuit or the input pin of the flipflop is computed, and the difference between the obtained allowable reaching time and the longest path delay to each block is computed, thereby obtaining a slack value.

Then, in S106, it is determined whether or not all block in the logical circuit have been optimized. It is assumed that a block assigned a device having a non-optimization attribute has been optimized. If the determination result is Yes, that is, it is determined that all blocks have been optimized, then the circuit delay optimizing process terminates.

On the other hand, if the result of the determining process in S106 is No, that is, if it is determined that there are blocks not yet optimized, then control is passed to the process in S107, and the block optimizing process is performed in order from the block having the smallest stage number.

Described below is the block optimizing process.

FIG. 4 is a flowchart showing the contents of the process of the first example of the block optimizing process.

In S111 in FIG. 4, the driving ability of a prior stage block is obtained by referring to the device which is specified to be used for a prior stage block (hereinafter referred to as a 'driver block') of a block to be optimized (hereinafter referred to as a 'optimization target block'), and the driving ability of the device defined in the above mentioned library. Since an optimization target block whose input pin is connected to an external input terminal has no preceding stage in the logical circuit, the process is performed by assuming that a standard inverter drives the block unless otherwise specified.

In S112, for all subsequent stage blocks to be driven by the optimization target block, the driving ability of each subsequent stage block is detected by referring to the device currently specified to be used for each block, and the driving ability of the device defined in the above mentioned library, and the sum of the driving ability values is computed. The sum can be recognized as the load capacity of the optimization target block. An optimization target block whose output pin is directly connected to an external output terminal has no block driven by an optimization target block in the circuit. Therefore, the process is performed by assuming that one standard inverter is driven unless otherwise specified.

In S113, for the driver block and the optimization target block, each device currently specified to be used for each block and the delay rate and the parasitic capacity of each device defined in the above mentioned library are referred to, and the delay rate and the parasitic capacity of each block are obtained.

In S114, according to the above obtained driving ability, load capacity, and delay rate of each block, the optimum driving ability of the optimization target block are obtained such that the delay from the driver block to the optimization target block is the shortest.

In S115, based on the optimum driving ability obtained in step S114, the device, which belongs to the same logical device group as the currently specified device for the optimization target block, and has the optimum driving ability satisfying the optimum driving ability of the optimization target block, is selected and replaces the current device after being specified for the optimization target block. After the process, control is returned to FIG. 3.

A practical example of optimizing a logical circuit by performing the process shown in FIGS. 3 and 4 by the CPU 101 is shown.

FIG. 5 shows an example of a library in which device information is defined.

Explained below is the terms shown in FIG. 5.

The parasitic capacity of an input pin refers to the capacity constantly maintained in the device as viewed from the input pin of the device.

The driving ability of an input pin is the capacity connected to an output pin, and shows the maximum value of the capacity which can be driven (can invert the logic of an output signal) when a signal is input into the input pin. This refers to the level of the ability to invert a logic, that is, to perform a transient operation.

The delay rate of an input pin indicates how much the driving ability of the input pin and the load capacity of the output pin influence a delay time if the delay occurs when a device is driven (inverts the logic of an output signal) during the travel of a signal from the input pin to the output pin of the device, and is expressed by the following equation.

Delay rate=(delay generated by unit load capacity)×(driving ability)÷(time of one period of reference clock in logical circuit to be optimized)

where the load capacity indicates the capacity applied to the output pin as a load when a transient operation of driving (inverting the logic of a signal) all devices at the subsequent stages connected to the output pin is performed.

The average frequency, average driving ability, and average parasitic capacity of a device respectively refer to the average values of the delay rate, driving ability, and parasitic capacity of each input pin of the device.

By referring to FIG. 5, the device having the device name 'AAA' is a 2-input NAND, and belongs to a device group '2-NAND'. The optimization for the device is defined as 'possible', and has no non-optimization attribute. Then, 50 areas are required to install the device, and the average delay rate is 1.3. The device has input pins A and B, and an output pin X. The input pin A is defined to have the delay rate of 1.2, the driving ability of 33.5, and the parasitic capacity of 9.0. The input pin B is defined to have the delay rate of 1.4, the driving ability of 32.0, and the parasitic capacity of 10.5.

In the process in S101 shown in FIG. 3, as described above, the library shown in FIG. 5 is read.

Figure 6:
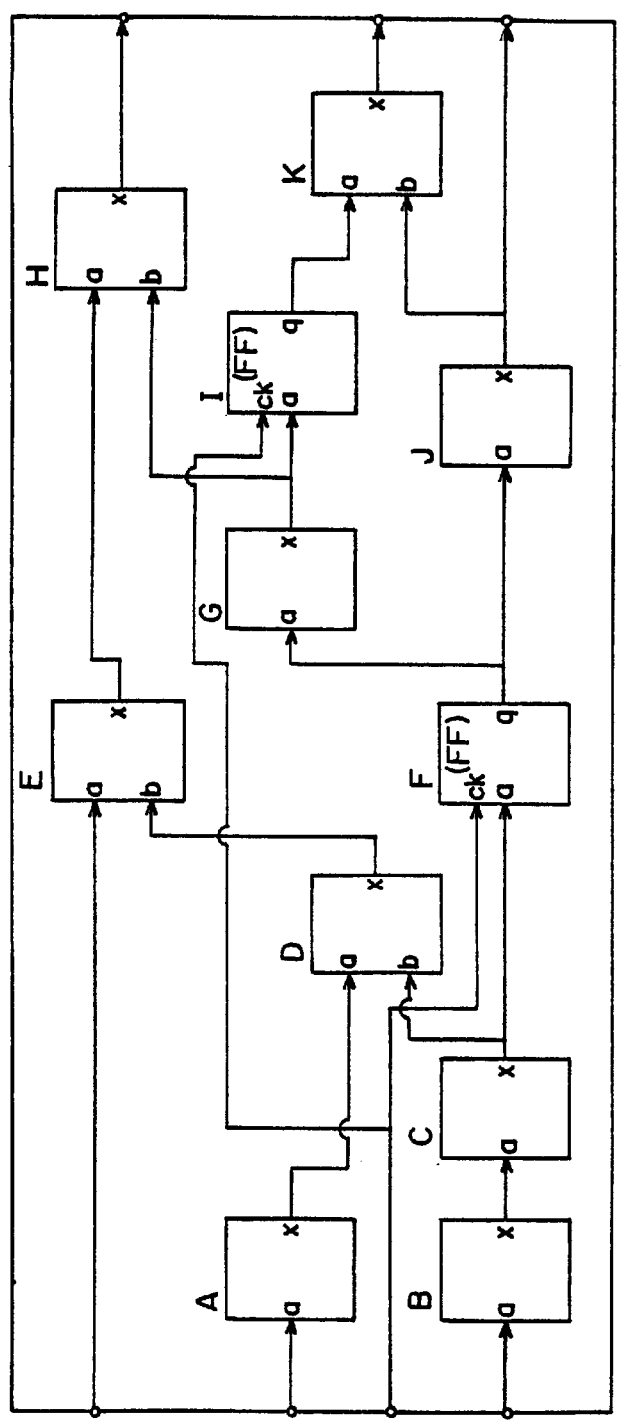
FIG. 6 shows an example of a circuit network for a delay optimizing process.

Described below is FIG. 6. FIG. 6 shows an example of a circuit network. In the circuit network shown in FIG. 6, the blocks F and I are flipflops. In the process in S102 shown in FIG. 3, the information indicating the circuit network shown in FIG. 6 is obtained.

In the following explanation, the circuit network shown in FIG. 6 is referred to as a 'circuit network A'.

Figure 7:
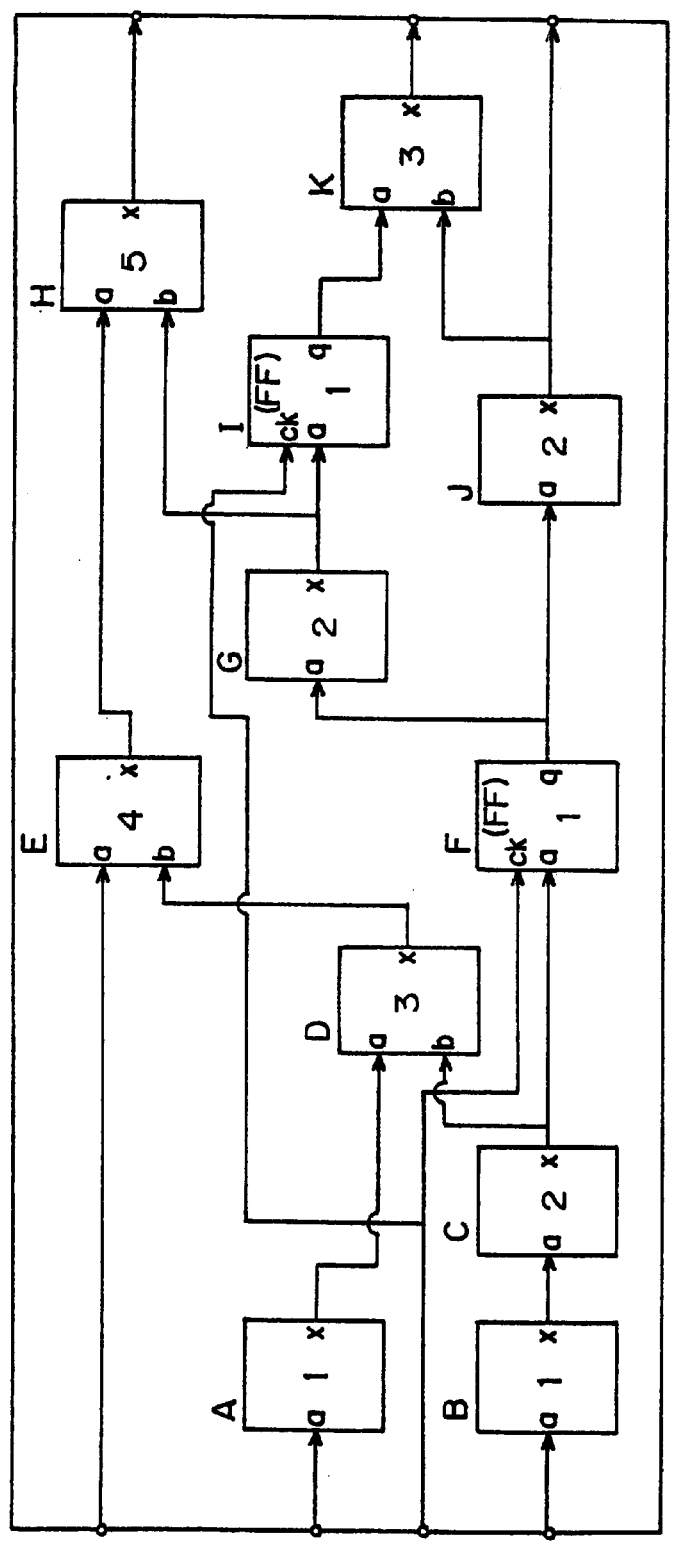
FIG. 7 shows a result of detecting the number of stages for each block in a circuit network A.

FIG. 7 shows a result of assigning a stage number to each block in the circuit network A by performing the process in S103 shown in FIG. 3. In FIG. 7, the figure in each block indicates the stage number of the block.

In FIG. 7, for example, there are two blocks A and C prior to the block D. In the two blocks, the stage number of the block C having a larger stage number is '2'. Therefore, the stage number '3' of the block D can be obtained by adding 1 to '2' which is the stage number of the block C. Similarly, the stage numbers of other blocks E, H, and K can be obtained by adding 1 to the largest stage number in the prior stage blocks.

Figure 8:
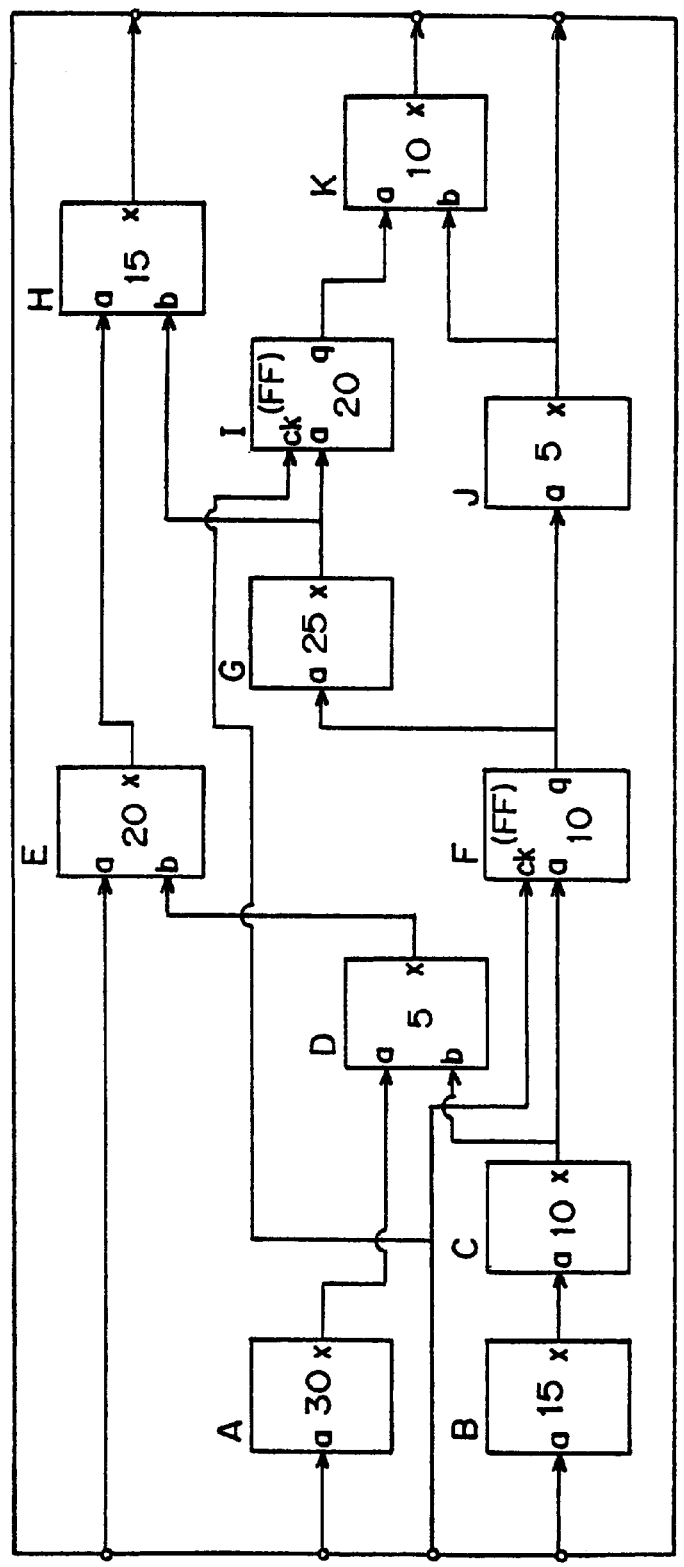
FIG. 8 shows delay computation performed on each block in a circuit network A.

FIG. 8 shows an example of a result of computing the delay for each block in the circuit network A by performing the process in S104 shown in FIG. 3. In FIG. 8, the figure in each block indicates the block delay from the input pin to the output pin of the block. The delay of each block can be computed by the following equation.

Block delay=(delay rate×load capacity/driving ability+parasitic capacity)×clock unit time    (1)

In the equation above, the load capacity is a sum of the driving ability values of all subsequent stage blocks connected to the output pin of the block.

When the computation is performed by the equation above, the average delay rate, average driving ability, average parasitic capacity of each block are used as the delay rate, driving ability, and parasitic capacity. A sum of average driving ability values of all subsequent stage blocks is used for the load capacity.

Figure 9:
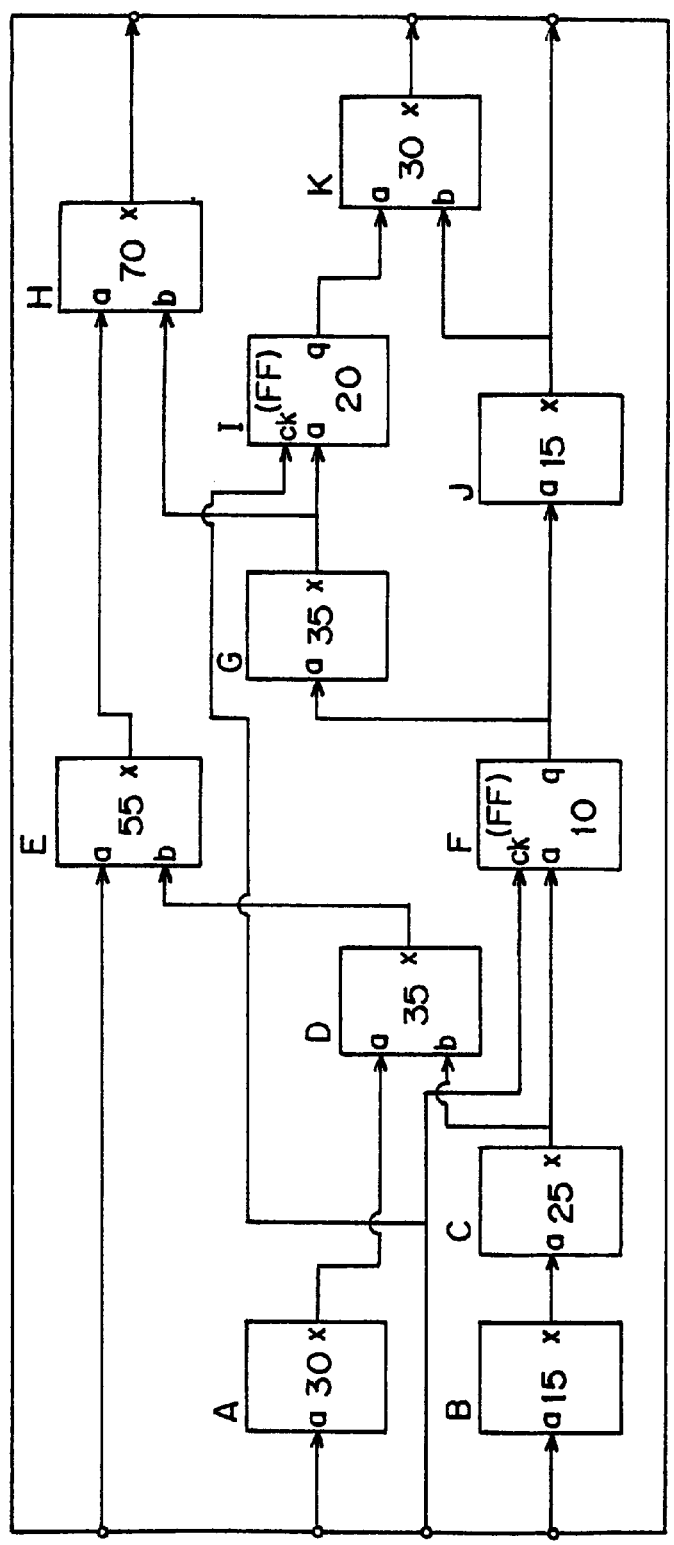
FIG. 9 shows an example of a result of the longest delay obtained from the computation performed on each block in a circuit network A.

FIG. 9 shows an example of a result of computing the longest delay performed on each block of the circuit network A after the delay computation shown in FIG. 8 by performing the process in S104 shown in FIG. 3. In FIG. 9, the figure in each block indicates the longest delay generated up to the output pin of the block.

In FIG. 9, for example, the longest delay up to the block D can be obtained by adding the delay of 5 of the block D itself to the longest delay of 30 of the block A having a longer delay up to the stage in the prior stage blocks A and C to the block D. The stage number of a block is not taken into account. Similarly, the longest delay of other blocks E, H, and K can be obtained by adding the delay of the block to the longest delay in the prior stage blocks.

Figure 10:
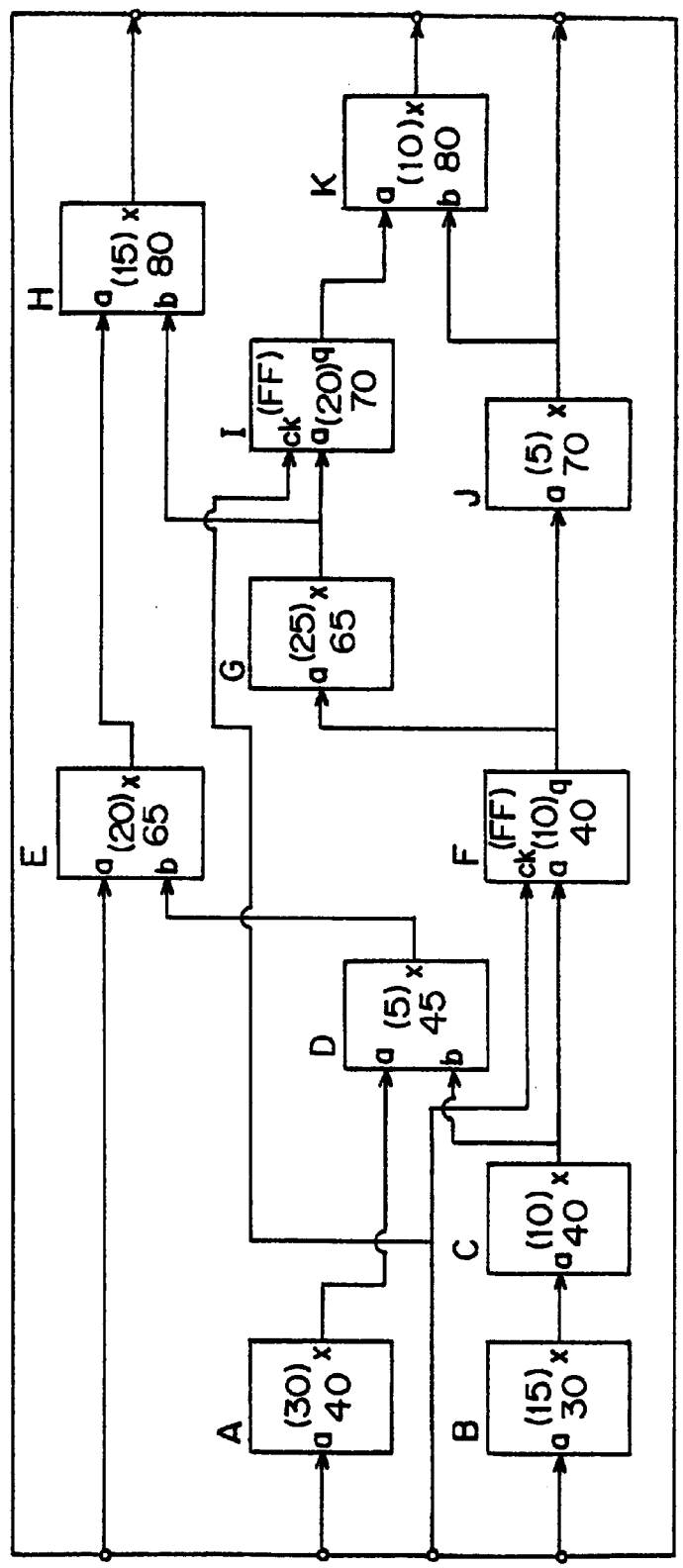
FIG. 10 shows an example of a result of the allowable reaching time obtained from the computation performed on each block in a circuit network A.

FIG. 10 shows an example of a result of the computation of an allowable reaching time performed on each block by performing the process in S105 shown in FIG. 3 by assuming that the allowable reaching time up to the block connected to the external output terminal or the input pin of the flipflop in the circuit network A is 80. In FIG. 10, the figure enclosed by the parentheses in each block indicates the device delay of each block shown in FIG. 7, and the figure shown below without parentheses indicates an allowable reaching time.

In FIG. 10, for example, in the block J, the output pin and the external output terminal are also connected to the block K. Since the allowable reaching time of the block K is 80, and its device delay is 10, the difference is 70, which indicates the allowable reaching time from the block J to the block K. Although the allowable reaching time of the path connected from the block J to the external output terminal at the external output terminal is originally 80, the limit of the allowable reaching time of the path to the block K is shorter. Therefore, the allowable reaching time of the block J is 70. Similarly defined are the times for other blocks.

Figure 11:
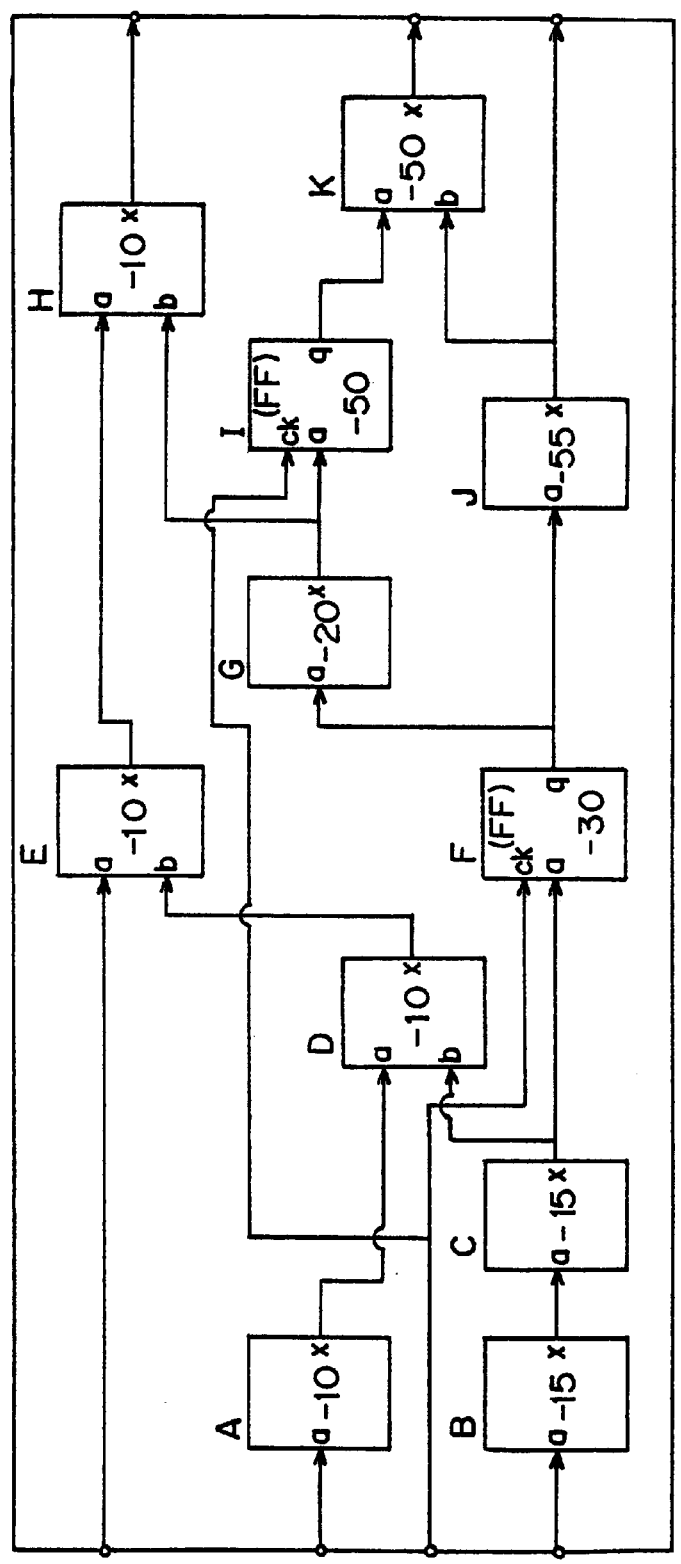
FIG. 11 shows an example of a result of the slack value obtained from the computation performed on each block in a circuit network A.

FIG. 11 shows an example of a result of the computation of a slack value performed on each block of the circuit network A by performing the process in S105 shown in FIG. 3. In FIG. 11, the figure in each block indicates the slack value of the block.

A slack value of a block refers to the difference between the longest delay predicted up to the block and the reaching time (allowable reaching time) allowed for the block, and indicates the timing allowance level. According to the present embodiment, a slack value can be obtained by subtracting the allowable reaching time of the block from the largest delay of the block. Therefore, when the sign of a slack value is positive and the value is larger, the illegal level about the allowable reaching time is more serious. On the other hand, when the sign of a slack value is negative and the value is smaller (when the sign of a slack value is negative and the absolute value is larger), the allowance for the allowable reaching time is larger.

In FIG. 11, for example, in the block J, the longest delay is 15 as shown in FIG. 9, and the allowable reaching time is 70 as shown in FIG. 10. Therefore, the difference of −55 is given as the slack value of the block.

Described below is the block optimizing process shown in FIG. 4 performed in S107 shown in FIG. 3.

The optimum driving ability of the optimization target block can be computed in S114 shown in FIG. 4 as follows.

The sum D of the delay generated in a driver block and the delay generated in an optimization target block can be derived from the above mentioned equation (1), and is given by the following equation.

$$D=(G1\times c2/C1+P1+G1\times C3/c2+P2)\times \tau \quad (2)$$

where

D indicates a delay of a driver block+a delay of an optimization target block;

C1 indicates the driving ability of a driver block;

G1 indicates the delay rate of a driver block;

P1 indicates the parasitic capacity of a driver block;

c2 indicates the driving ability (=load capacity of a driver block) of an optimization target block;

G2 indicates the delay rate of an optimization target block;

P2 indicates the parasitic capacity of an optimization target block;

C3 indicates the load capacity of an optimization target block; and

τ indicates a clock unit time.

If the value obtained by differentiating the equation (2) by c2 is 0, then the delay of the portion is the shortest. Therefore, the above mentioned value of c2 is the optimum driving ability. The value of c2 is given by solving the following equation (3).

$$\frac{\partial D}{\partial c2}=G1\times \frac{\tau}{C1}-G2\times \frac{C3\times \tau}{c2^2}=0 \quad (3)$$

$$\therefore c2=\sqrt{\frac{G2\times C1\times C3}{G1}}$$

The value of c2 is the optimum driving ability.

Described below is an example of selecting a device based on the optimum driving ability obtained in S115 shown in FIG. 4 as described above.

In this example, it is assumed that the name of the logical device group to which the device of the optimization target block is 'INVERTER', and that the names of the devices belonging to the group and their driving ability values are defined in the library as follows.

TABLE 1

| DEVICE NAME | DRIVING ABILITY |
|---|---|
| INV1 | 10.0 |
| INV2 | 13.0 |
| INV3 | 16.0 |
| INV4 | 19.0 |
| INV5 | 22.0 |
| INV6 | 25.0 |

When the optimum driving ability of the optimization target block obtained in the process in S114 shown in FIG. 4 is 14.0, 'INV 2' having the closest driving ability value of 13.0 is selected according to Table 1 above. As a result, the current device is replaced with the selected device as the optimum device for the optimization target block in the process in S115.

Figure 12:
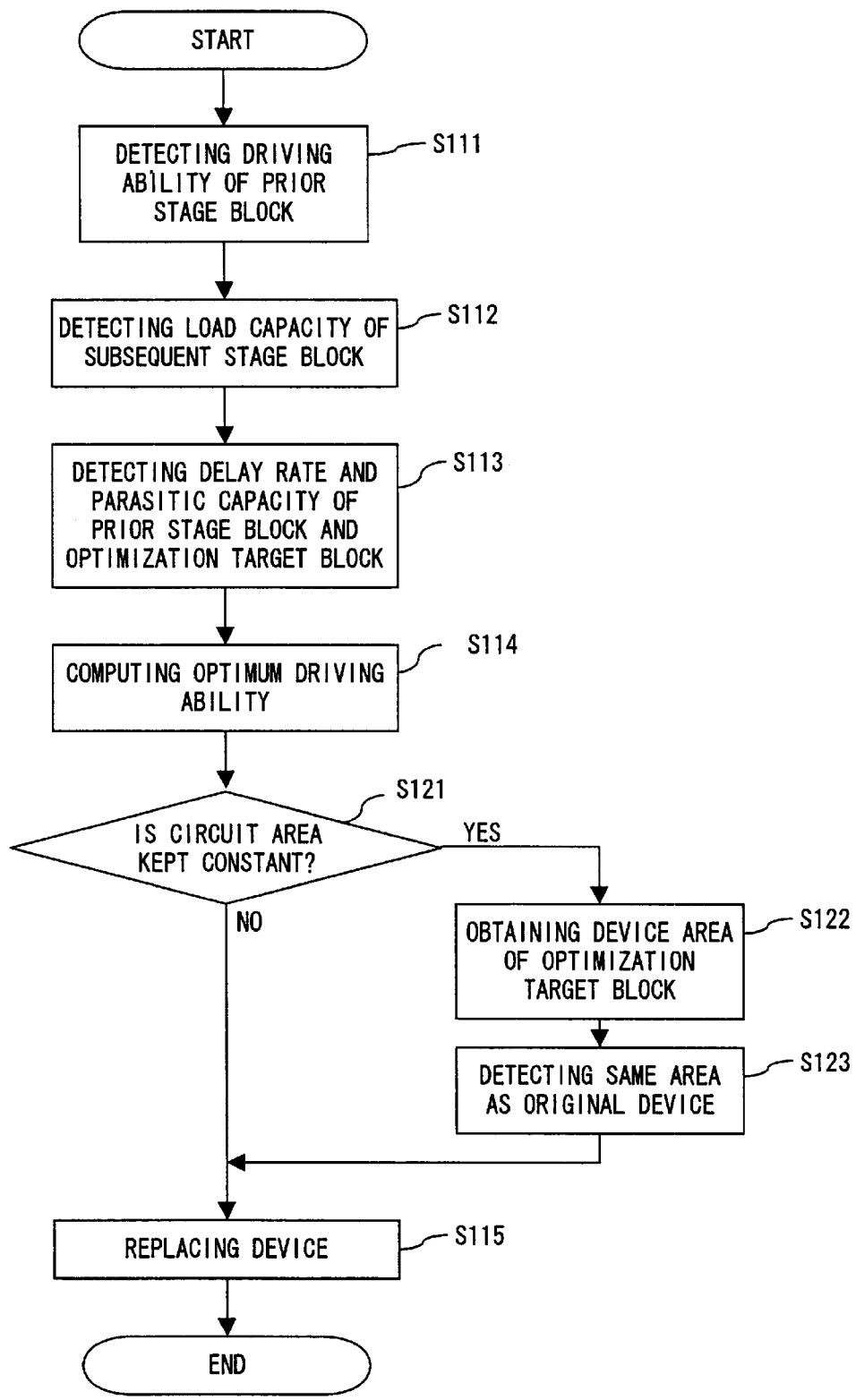
FIG. 12 is a flowchart showing the contents of the second example of the block optimizing process.

Described below is the process shown in FIG. 12. FIG. 12 is a flowchart showing the contents of the process of the second example of the block optimizing process. The second process is performed to suppress an excessive increase of installation areas by the optimization.

In FIG. 12, the step referring to the same process contents as in FIG. 4 is assigned the same step number. It is clear, by referring to the flowchart showing the contents of the process of the first example of the block optimizing process shown in FIG. 4 as compared with FIG. 12, that the second example is obtained by adding the processes in S121 through S123 between the processes in S114 and S115 shown in FIG. 4.

In FIG. 12, in S121 after S115, it is checked according to the circuit network information obtained in the process in S102 shown in FIG. 3 whether or not an instruction to change a circuit area for the optimization target block has been issued. If the determination result is Yes in S121, that is, the instruction has been issued, then the device area for the device currently specified for the optimization target block defined in the above mentioned library is obtained in S122, and the device having the device area of the optimization target block in the devices belonging to the same logical device group as the device currently specified for the optimization target block is defined as a probable subsequent device to be selected in replacing the device in S123. Then, control is passed to S115. In S115, the current device is replaced such that the probable device to be selected can be specified as the device to be used for the optimization target block.

On the other hand, if the determination result in S121 is No, that is, if the above mentioned instruction has not been issued, then control is immediately passed to S115, and the similar process is performed as shown in FIG. 4.

Described below is a practical example of optimizing a logical circuit by performing the process shown in FIG. 12 by the CPU 101.

It is assumed that the name of the logical device group to which the device of the optimization target block belongs is 'INVERTER', and that the name of the device included in the group, its driving ability, and the device area are defined in the library as shown in the table below.

TABLE 2

| DEVICE NAME | DRIVING ABILITY | DEVICE AREA |
|---|---|---|
| INV1 | 10.0 | 20 |
| INV2 | 13.0 | 20 |
| INV3 | 16.0 | 30 |
| INV4 | 19.0 | 30 |
| INV5 | 22.0 | 40 |
| INV6 | 25.0 | 40 |

If the device currently specified for the optimization target block is 'INV 4', then the device area is 30 according to the table above. The devices in the group of devices having the device area of 30 are 'INV 3' and 'INV 4' according to the table above. Therefore, when an instruction not to change the circuit area is issued, the two devices are probable devices to be selected in replacing the current device.

If the optimum driving ability of the optimization target block obtained in the computation is 14.0, then the 'INV 3' having the closest driving ability is selected as the optimum device for the optimization target block, and replaces the current device. As a result, the circuit area of the optimization target block can be maintained although the optimization is performed, thereby suppressing the excessive increase of the installation area.

Described below is the process shown in FIG. 13. FIG. 13 is a flowchart showing the contents of the process of selecting a representative pin. This process is performed when the optimizing process is performed if the optimization target block has a plurality of input pins. The driving ability of the input pin to which the prior stage block to the optimization target block having the longest delay is connected is optimized instead of optimizing the input pin in the critical path in the conventional technology.

The process shown in FIG. 13 is performed in the process in S111 in the block optimizing process shown in FIG. 4 or 12.

First, in S131, it is determined whether or not the optimization target block is a block for receiving multiple signals, that is whether or not the block has a plurality of input pins. Only when the determination result is Yes, the value of the longest delay of each prior stage block to which each input pin is connected is obtained in S132.

In the next S133, the input pin connected to the block having the largest value of the obtained values is selected as the representative pin of the optimization target block. If the determination result in S131 is No, that is, if the optimization target block has only one input pin, then the pin is the representative pin.

Described below is a practical example of selecting the representative pin of the optimization target block by the CPU 101 performing the above mentioned representative pin selecting process.

In FIG. 9, for example, the block D is checked as the optimization target block.

The block D has input pins a and b. The prior stage blocks connected to these two input pins are blocks A and C. The values of the longest delays up to these blocks are respectively 30 and 25 as shown in FIG. 9, and the value for the block A is larger. Therefore, in the block D, the pin a connected to the block A is a representative pin.

Then, assume that the block C is the optimization target block. Since the input pin of the block C is only the input pin a, the pin a is the representative pin of the block C.

Figure 14:
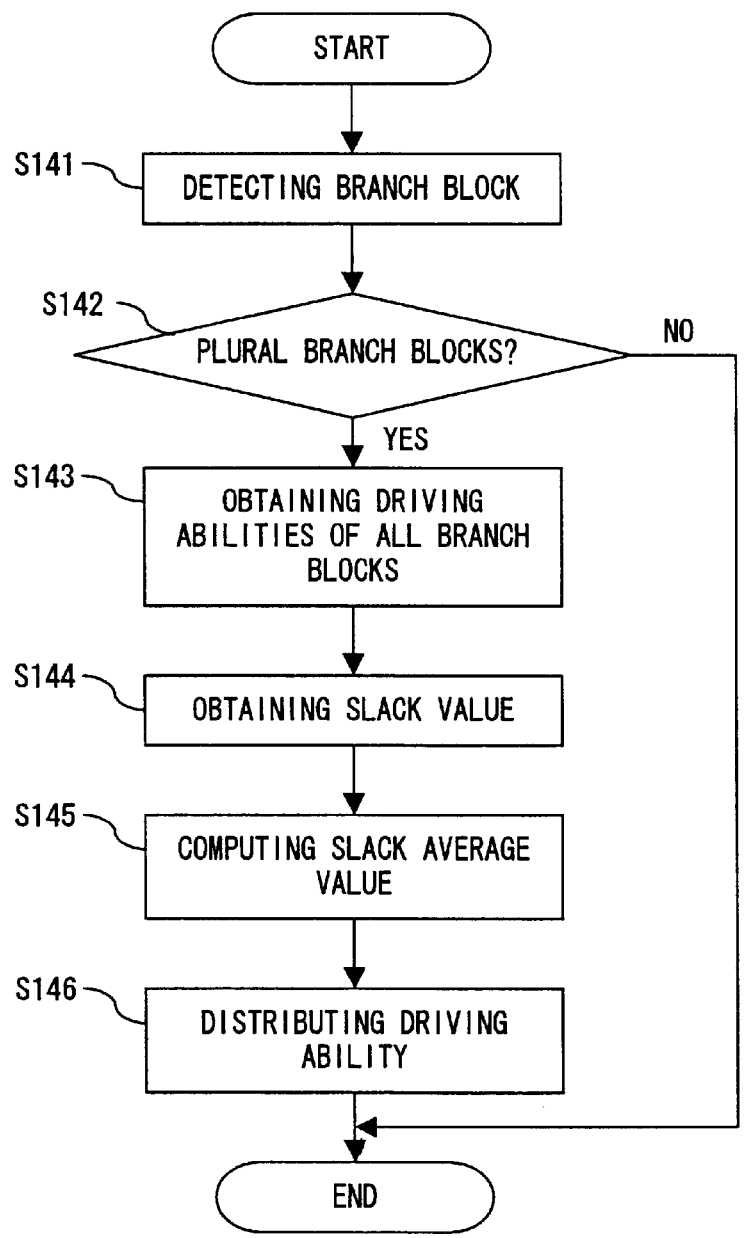
FIG. 14 is a flowchart of the contents of the driving ability distributing process.

Described below is the process shown in FIG. 14. FIG. 14 is a flowchart showing the contents of the driving ability distributing process. In this process, no excessive driving ability is required in the optimization to be performed later on each block by standardizing the difference in driving abilities specified for respective subsequent stage blocks based on the slack value (timing allowance level) after optimizing the optimization target block to which a plurality of blocks are connected at the subsequent stages, that is, the optimization target block having a plurality of fanouts.

The process shown in FIG. 14 is performed immediately after the block optimizing process in S107 in the circuit delay optimizing process shown in FIG. 3.

In FIG. 14, in S141, all blocks which are at the stages subsequent to the optimization target block, and whose input pins connected to the output pin of the optimization target block are the representative pins of the block are detected. In the following explanation, the subsequent stage blocks detected in the process are referred to as 'branch blocks'.

In the next S142, it is determined whether or not a plurality of branch blocks have been detected. If the determination result is Yes, then control is passed to S143. On the other hand, if the determination result is No, then the driving ability of a branch block is not distributed, and the driving ability distributing process terminates.

In S143, the driving abilities of the representative pins of branch blocks are obtained from the definition in the above mentioned library, and the sum of the values is computed.

In S144, the slack value of each branch block, which has already been computed in S105 shown in FIG. 3, is obtained. In S145, an average value (slack average value) of the obtained slack values is computed.

In S146, based on the difference between the computed slack average value and the slack value of each branch block, the driving ability for holding the driving ability of the entire branch block is computed for each branch block, and is distributed to each branch block.

The driving ability obtained in the above mentioned driving ability distributing process is set as the driving ability before the optimization for each branch block, and the optimizing process for these branch blocks is performed later.

Described below is a practical example of distributing the driving ability for a branch block by the CPU 101 performing the driving ability distributing process.

Figure 15:
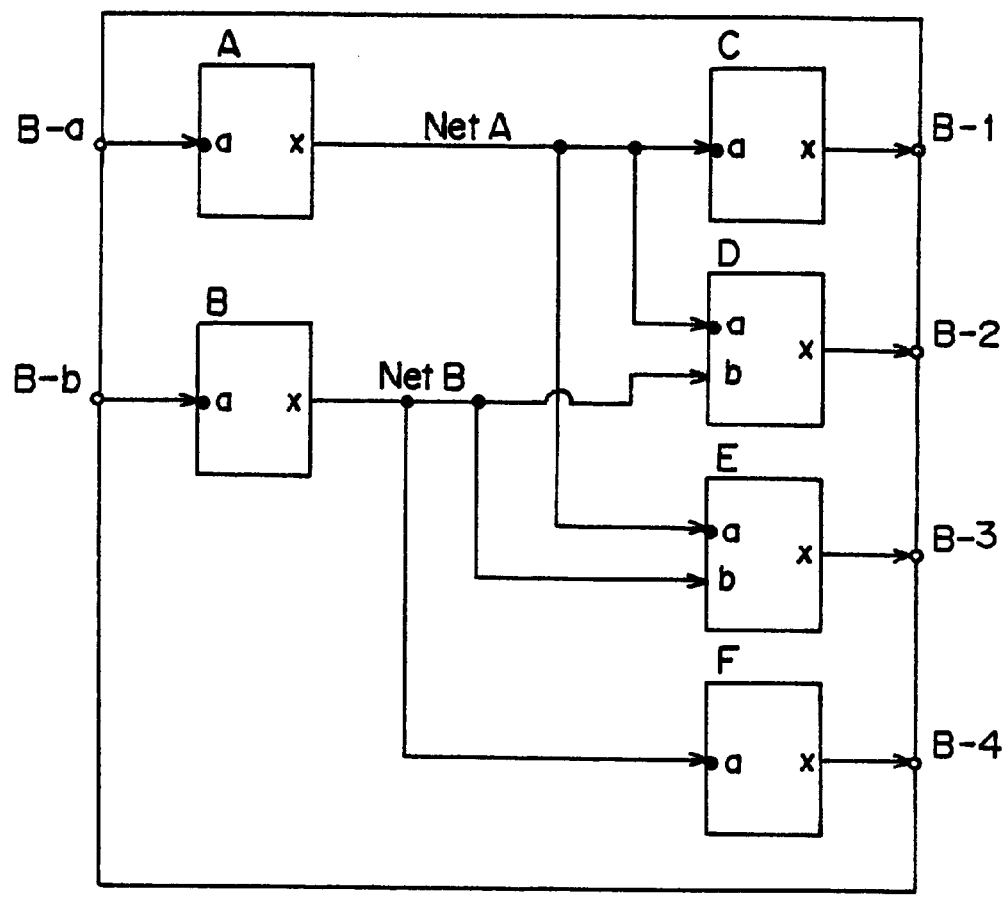
FIG. 15 shows an example of a circuit network for a driving ability distributing process.

FIG. 15 shows an example of a circuit network through which the driving ability distributing process is performed. In FIG. 15, the input pins a and b of each block marked with black dots are representative pins of the block.

In the following explanation, the circuit network shown in FIG. 15 is referred to as a circuit network B'.

In the circuit network B, when the block A is selected as the optimization target block, the output pin x of the block A is connected to the input pins a of the blocks C, D, and E. The input pins a of the blocks C, D, and E are representative pins as shown in FIG. 15. Therefore, the branch blocks for the optimization target block A are the blocks C, D, and E.

In the circuit network B, when the block B is selected as a optimization target block, the output pin x of the block B is connected to the input pins b of the blocks D and E, and to the input pin a of the block F. The input pins b of the blocks D and E are not representative pin, and the input pin a of the block F is a representative pin as shown in FIG. 15. Therefore, the branch block for the optimization target block is the block F only.

The explanation of the branch blocks C, D, and E for the optimization target block A is continued below. The device names, the driving abilities of the representative pins, and the slack values of these branch blocks are listed in the table below.

TABLE 3

| | DEVICE NAME | DRIVING ABILITY | SLACK VALUE |
|---|---|---|---|
| BLOCK C | INV2 | 13.0 | −20.0 |
| BLOCK D | 2NAND4 | 19.0 | −45.0 |
| BLOCK E | 2NOR3 | 16.0 | −55.0 |

In the table above, the sum of the driving ability values of the branch blocks is 48.0, and the slack average value is −40.0.

The driving ability of a branch block having a slack value equal to or larger than the average value, that is, having lower timing allowance, is computed as follows.

$$C'=C+k\times C\times(S-Sav) \quad (4)$$

where
C' indicates the driving ability computed value;
C indicates the driving ability currently specified for the branch block;

S indicates the slack value of the branch block;

Sav indicates the slack average value of the entire branch block; and k indicates an amendment coefficient.

For example, assuming that the amendment coefficient k is 0.01, the block C whose slack value is equal to or larger than an average value according to Table 3, that is, the block having low timing allowance, has C'=15.6, which is higher than the current value specified for the block C. The amendment coefficient k is appropriately set based on the actual measurement results, etc. by experience and experiment.

Then, the driving ability of the branch block having a slack value smaller than an average value, that is, having high timing allowance, is computed as follows.

First, computation is performed using the driving ability computed value C' of the branch block having a slack value smaller than an average value.

$$Cdiff=\Sigma(C'-C) \quad (5)$$

In the equation above, Cdiff is a sum of driving ability differences.

In Table 3, Cdiff is computed as 2.6.

Then, for a branch block having a slack value smaller than an average value, the sum Sdiff of driving ability×(slack average value−slack value) is computed by the following equation.

$$Sdiff=\Sigma(C\times(Sav-S)) \quad (6)$$

In Table 3 above, the branch blocks having slack values smaller than an average value are blocks D and E, and the Sdiff is obtained as 335.0.

Thus, based on the obtained Cdiff and Sdiff values, the driving ability of a block having a slack value larger than an average value is computed by the following equation.

$$C'=C-Cdiff\times C\times(Sav-S)/Sdiff \quad (7)$$

In Table 3, for the blocks D and E which are branch blocks having slack values smaller than an average value, that is, having high timing allowance, the block D has the value of C'=18.3, and the block E has the value of C'=14.1. Thus, the blocks D and E are assigned lower driving abilities than the currently specified values. As described above, since requested driving abilities for the blocks D and E are suppressed, the installation area can be reduced.

Figure 16:
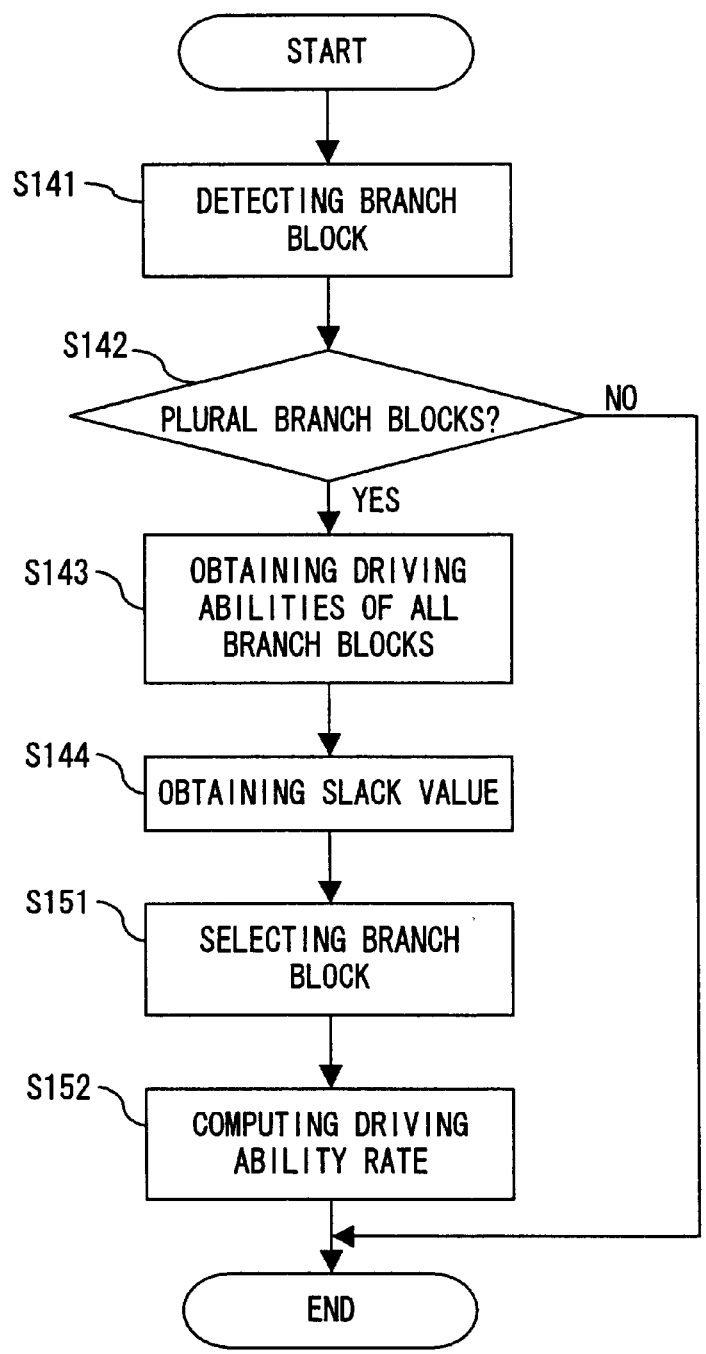
FIG. 16 is a flowchart of the contents of the driving ability ratio computing process.

Described below is the process shown in FIG. 16. FIG. 16 is a flowchart showing the contents of the driving ability ratio computing process. The process is performed to compute the ratio (driving ability ratio) of the driving ability of the entire branch block of the optimization target block to the smallest driving ability specified for the branch blocks. In the process explained later, a branch block is optimized using the value of the driving ability ratio.

In FIG. 16, the steps having the same contents as in FIG. 14 are assigned the same step numbers. It is clear, by referring to the flowchart showing the contents of the driving ability distributing process shown in FIG. 14 as compared with FIG. 16, that the process shown in FIG. 16 is obtained by replacing the processes in S145 and S146 shown in FIG. 14 with the processes in S151 and S152.

The driving ability ratio computing process is performed on the branch blocks at the stages subsequent to the optimization target block after the block optimization is completed on the optimization target block, and is performed after the block optimizing process in S107 in the circuit delay optimizing process shown in FIG. 3, and immediately after the driving ability distributing process shown in FIG. 14.

In FIG. 16, in S151 after the process in S144, a branch block having the largest slack value in the branch blocks, that is, a branch block having the lowest timing allowance, is selected.

Then, in S152, the ratio of the already computed sum of the entire driving ability of the branch blocks to the driving ability of the branch block having the largest slack value, that is, the driving ability ratio is computed.

Described below is a practical example of computing the driving ability ratio by the CPU 101 performing the driving ability ratio computing process.

In the branch blocks C, D, and E of the block A in the circuit network B shown in FIG. 15, the device name, driving ability, slack value, and driving ability computed value (values computed in the above mentioned driving ability distributing process) of each branch block are listed below.

TABLE 4

| DEVICE NAME | DRIVING ABILITY | SLACK VALUE | DRIVING ABILITY COMPUTED VALUE |
|---|---|---|---|
| BLOCK C | INV2 | 13.0 | −20.0 | 15.6 |
| BLOCK D | 2NAND4 | 19.0 | −45.0 | 18.3 |
| BLOCK E | 2NOR3 | 16.0 | −55.0 | 14.1 |

In the table above, the sum of the driving abilities of the branch blocks is 48.0, and the branch block having the largest slack value in the branch blocks, that is, the branch block having the lowest timing allowance, is the block C having the slack value of −20.0.

In Table 4 above, the driving ability computed value of the block C is 15.6. Therefore, the driving ability ratio m is obtained by the following equation.

$$m=48.0/15.6=3.1$$

Described below is the optimization of a branch block using the driving ability ratio. FIG. 17 is a flowchart showing the contents of the above mentioned change rate reflecting process performed using the driving ability ratio.

The driving ability change rate reflecting process is performed on a branch block at a stage subsequent to the optimization target block after completing the block optimization for the optimization target block, and is performed after the block optimizing process in S107 in the circuit delay optimizing process shown in FIG. 3, and immediately after the driving ability distributing process shown in FIG. 14.

In FIG. 17, the step having the same process contents as in FIG. 16 is assigned the same step number. It is clear, by referring to the flowchart showing the contents of the process of the driving ability ratio computing process shown in FIG. 16 as compared with FIG. 17, that the process shown in FIG. 17 is obtained by adding the processes in S153 through S158 after the process in S152 shown in FIG. 16.

In S153 after S152, the optimum driving ability of the branch block having the largest slack value in the branch block connected to the same driver block, and having the lowest timing allowance is computed. At this time, the driving ability ratio computed in the process in S152 is used.

In S154, the device belonging to the same logical device group as the device currently specified for the branch block, and having the optimum driving ability satisfying the optimum driving ability of the branch block is selected based on the optimum driving ability obtained in the prior step, and the specification of the branch block is changed such that the selected device can be used.

In S155, the change rate of the driving ability of the branch block having the largest slack value is computed based on the driving ability of the device replaced in the process in S154, and the driving ability set before the replacement.

Then, in S156, it is determined whether or not all branch blocks connected to the same driver block have been optimized. If the result of the determining process is Yes, that is, if it is determined that all branch blocks have been optimized, then the driving ability optimization reflecting process terminates.

If the result of the determining process is No, that is, if there is a branch block not optimized yet, then control is passed to S157.

In S157, the optimum driving ability of a branch block is computed based on the driving ability of the branch block to be optimized and the driving ability change rate of the block having the largest slack value.

In S158, the device belonging to the same logical device group as the device currently specified for the branch block, and having the optimum driving ability satisfying the optimum driving ability of the branch block is selected based on the optimum driving ability obtained in the prior step, and the specification of the branch block is changed such that the selected device can be used. After the process, control is passed to S156, and the above mentioned processes are repeated.

Described below further in detail is the above mentioned driving ability optimization reflecting process.

First, the above mentioned driving ability ratio, that is, the value obtained by dividing the driving ability of the entire branch blocks, by the driving ability of the branch block having the largest slack value is set as m.

When the optimum driving ability of the branch block having the largest slack value in the process in S153 shown in FIG. 17 is computed, the equation (2) used to perform the process in S114 shown in FIG. 4 is replaced with the following equation.

$$D = \left( G1 \times \frac{c2 \times m + Cother}{C1} + P1 + G2 \times \frac{C3}{c2} + P2 \right) \times \tau \quad (8)$$

where

D indicates the delay of the optimized block+the delay of the optimization target branch block;

C1 indicates the driving ability of the optimized block;

G1 indicates the delay rate of the optimized block;

P1 indicates the parasitic capacity of the optimized block;

c2 indicates the driving ability of the optimization target branch block;

G2 indicates the delay rate of the optimization target branch block;

P2 indicates the parasitic capacity of the optimization target branch block;

C3 indicates the load capacity of the optimization target branch block;

$\tau$ indicates the clock unit time; and

Cother indicates a sum of the load capacities (including the load capacity of the network) of the optimized block excluding the optimization target branch block.

Therefore, the load capacity of the optimized block can be expressed by c2×m+Cother.

If the value obtained by differentiating the equation (8) by c2 is 0, the delay of this portion is the smallest. Therefore, such a value of c2 is the optimum driving ability. The value of c2 is given by solving the following equation (9).

$$\frac{\partial D}{\partial c2} = G1 \times \frac{m \times \tau}{C1} - G2 \times \frac{C3 \times \tau}{c2^2} = 0 \quad (9)$$

$$\therefore c2 = \sqrt{\frac{G2 \times C1 \times C3}{G1 \times m}}$$

The value of c2 is defined as the optimum driving ability of the optimization target branch block.

In the computation of the change rate of the driving ability in the process in S155 shown in FIG. 17, the value obtained by dividing the driving ability of the device replaced by the optimization in the process in S154 by the driving ability computed value of the device before the replacement is defined as a driving ability change rate. In this example, the driving ability change rate is expressed as a coefficient G.

In Table 4, the block C has the driving ability computed value of 15.6 before the optimization. In this example, if the driving ability of the device replaced in the optimization performed on the block C is 16.0, then the value of the coefficient G is 1.026.

On the other hand, the optimum driving ability of another branch block whose slack value is not the smallest is obtained by multiplying the driving ability computed value by the coefficient G. For example, the driving ability computed value of the block D which is a branch block whose slack value is not the smallest is 18.3 according to Table 4. Assuming that the coefficient G is 1.026, then the optimum driving ability of the block D is 18.8. Therefore, in the optimization of the block D, the device belonging to the same logical device group as the device currently specified for the block D and having the driving ability closest to the optimum driving ability obtained in the above mentioned computation replaces the current device.

Described below is the process shown in FIG. 18. FIG. 18 is a flowchart showing the contents of the pin driving ability specification detecting process. This process is performed to allow the user to arbitrarily indicate the driving ability value of the input pin of an external device connected to the input terminal of the logical circuit network to be optimized when the delay optimization is performed; the load capacity value (that is, the driving ability value) of the input pin of the external device connected to the output terminal of the logical circuit network; or the driving ability value of the input pin of the internal block of the circuit to the present apparatus instead of applying a predetermined value defined in the above mentioned library so that the connection to an actual predicted external terminal can be realized again, and so that the optimization can be realized with a change taken into account at the point where a circuit configuration change can be predicted.

The process in FIG. 18 is performed immediately after the information about the circuit network to be optimized is read in the process in S101 and S102 in the circuit delay optimizing process shown in FIG. 3.

In FIG. 18, first in S161, it is determined whether or not an external instruction about the driving ability of a pin has been issued to the input unit 105. If the determination result is Yes, then control is passed to S162. If the determination result is No, then the pin driving ability specification detecting process terminates without performing any process.

In S162, the driving ability indicated to the input unit 105 is read.

In S163, it is determined whether or not the retrieving process in S164 described later has been performed on all pins indicated to the input unit 105. If the determination result is Yes, the pin driving ability specification detecting process terminates. If the determination result is No, then control is passed to S164.

In S164, a pin indicated to the input unit 105 is retrieved from the logical circuit network to be optimized, and it is determined in S165 whether or not the pin exists in the logical circuit network. Only when the determination result in S164 is Yes, the driving ability value of the pin is changed into the value indicated to the input unit 105 in S166, and the result is reflected by the optimizing process to be performed later. Then, control is returned to S163, and the above mentioned processes are repeated.

Described below is a practical example of reflecting the indication of the driving ability of a pin by the CPU 101 performing the process shown in FIG. 18.

First, in the circuit network B shown in FIG. 15, the driving ability of each input pin is assumed to be defined as shown in the following table.

TABLE 5

| NAME OF PIN | DRIVING ABILITY | DEVICE NAME |
| --- | --- | --- |
| CIRCUIT NETWORK B-a | 10.0 | — |
| CIRCUIT NETWORK B-b | 10.0 | — |
| BLOCK A-a | 19.0 | INV4 |
| BLOCK B-a | 10.0 | INV1 |
| BLOCK C-a | 13.0 | INV2 |
| BLOCK D-a | 18.5 | 2NAND4 |
| BLOCK D-b | 19.5 | |
| BLOCK E-a | 17.0 | 2NOR3 |
| BLOCK E-b | 15.0 | |
| BLOCK F-a | 16.0 | INV3 |

At this time, if an external inspection indicates 'block C-a=10.0', and 13.0 is defined for the block C-a in the library, then 10.0 is set as the driving ability value before the optimization. Simultaneously, when 'circuit network B-a= 13.0' is indicated, 13.0 is set for the circuit network B-a pin as a driving ability value. This indication refers to the block A-a pin being driven in the block having the driving ability of 13.0.

If 'block B-b=16.0' is indicated, it is ignored because the block B-b pin does not exist in the circuit network B.

Described below is the process shown in FIG. 19. FIG. 19 is a flowchart showing the contents of the network load capacity reflecting process. This process is performed to realize the delay optimization with the network capacity, that is, the capacity caused by the wiring between blocks, reflected. The network capacity can be partially obtained from the information about the installation design if the circuit delay optimization is performed again, for example, when a logical circuit is installation-designed to some extent.

The process shown in FIG. 19 is performed immediately after the information about the circuit network to be optimized is read in the process in S101 and S102 in the circuit delay optimizing process shown in FIG. 3.

In FIG. 19, first in S171, it is determined whether or not the input unit 105 is instructed to reflect the load capacity of the network by the delay optimization. If the determination result is Yes, control is passed to S172. On the other hand, if the determination result is No, then the network load capacity reflecting process terminates without performing any process.

In S172, the information about the load capacity of each network in the circuit network to be optimized is extracted from the database containing installation information, and the information is read from the I/F unit 104 through the communications network in S173.

In S174, it is determined whether or not the retrieving process in S175 described later has been performed on the information about all extracted network capacities. If the determination result is Yes, then the network load capacity reflecting process terminates. On the other hand, if the determination result is No, then control is passed to S175.

In S175, the network (wiring) corresponding to the obtained information about the network capacity is retrieved from the logical circuit network to be optimized, and it is determined in S176 whether or not the network exists in the logical circuit network. Only when the determination result in S176 is Yes, the load capacity of the network is changed into a value indicated in the information obtained from the standard value, and is reflected by the optimizing process performed later. Then, control is returned to S174, and the above mentioned process are repeated.

Described below is a practical example of reflecting the load capacity of a network by the CPU 101 performing the process shown in FIG. 19.

First, it is assumed that there is a database DB1 containing the installation information about the circuit network B shown in FIG. 15.

The database DB1 contains the installation wiring information about the networks NetA and NetB, and, together with the information, the load capacity information Cneta and Cnetb about the networks. When these pieces of information are extracted in the process in S172 shown in FIG. 19, the text information in the following format is transmitted from the database DB1 to the present apparatus.

NetCapacity {
   NetA=Cneta;
   NetB=Cnetb;

. . .   . . .   . . .

The CPU 101 reads and interprets the above mentioned information. The load capacity Cneta is set in NetA, and the load capacity Cnetb is set in NetB.

With the values set, for example, the load capacity of the block A is a sum of the driving abilities of the blocks C-a, D-a, and E-a and the network load capacity Cneta.

Figure 20:
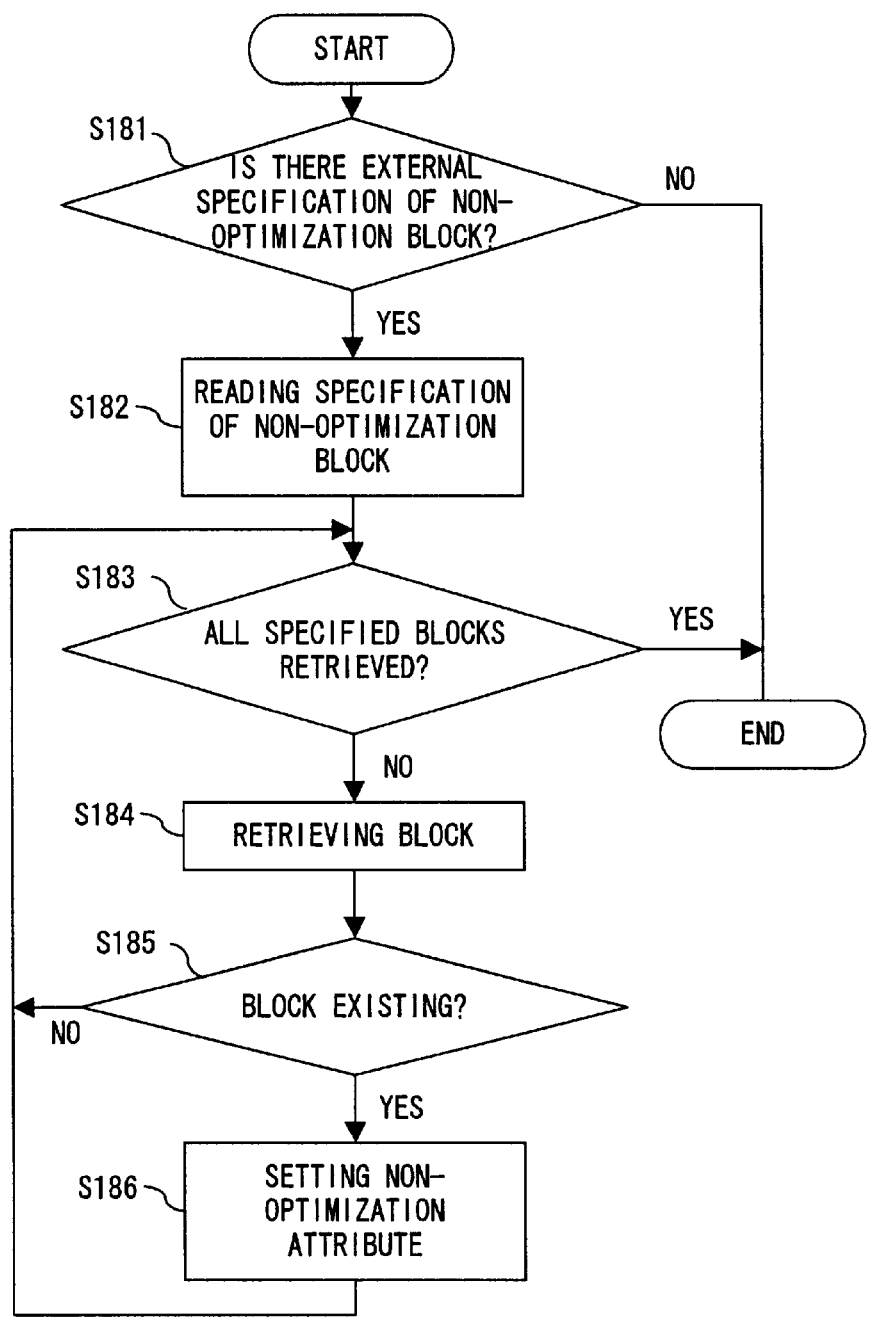
FIG. 20 is a flowchart of the contents of the block non-optimization specification detecting process.

Described below is the process in FIG. 20. FIG. 20 is a flowchart showing the contents of the non-optimization specification detecting process. This process is performed not to realize the optimization at an instruction of a user on a block in the target logical circuit network in performing delay optimization. For example, it is effective when there is room for an installation area of a logical circuit and a signal delay, a new installation design is not performed, and an existing design is used as is.

The process in FIG. 20 is performed immediately after the information about the circuit network to be optimized is read in the process in S101 and S102 in the circuit delay optimizing process shown in FIG. 3.

In FIG. 20, first in S181, it is determined whether or not an external instruction for the non-optimization of a block, that is, an external instruction not to optimize a part of a circuit block, has been input to the input unit 105. If the determination result is Yes, then control is passed to S182. On the other hand, if the determination result is No, then the non-optimization specification detecting process terminates without performing any process.

In S182, the information indicating the block not to be optimized and issued to the input unit 105 is read.

In S183, it is determined whether or not the retrieving process in S184 described later has been performed on all blocks indicated to the input unit 105. If the determination result is Yes, the block non-optimization specification detecting process terminates. On the other hand, if the determination result is No, then control is passed to S184.

In S184, the block indicated to the input unit 105 is retrieved from the logical circuit network to be optimized, and then it is determined whether or not the block exists in the logical circuit network in S185. Only when the determination result in S185 is Yes, the attribute indicating non-optimization is set in the block in S186. Afterwards, control is returned to S183, and the above mentioned processes are repeated.

Figure 21:
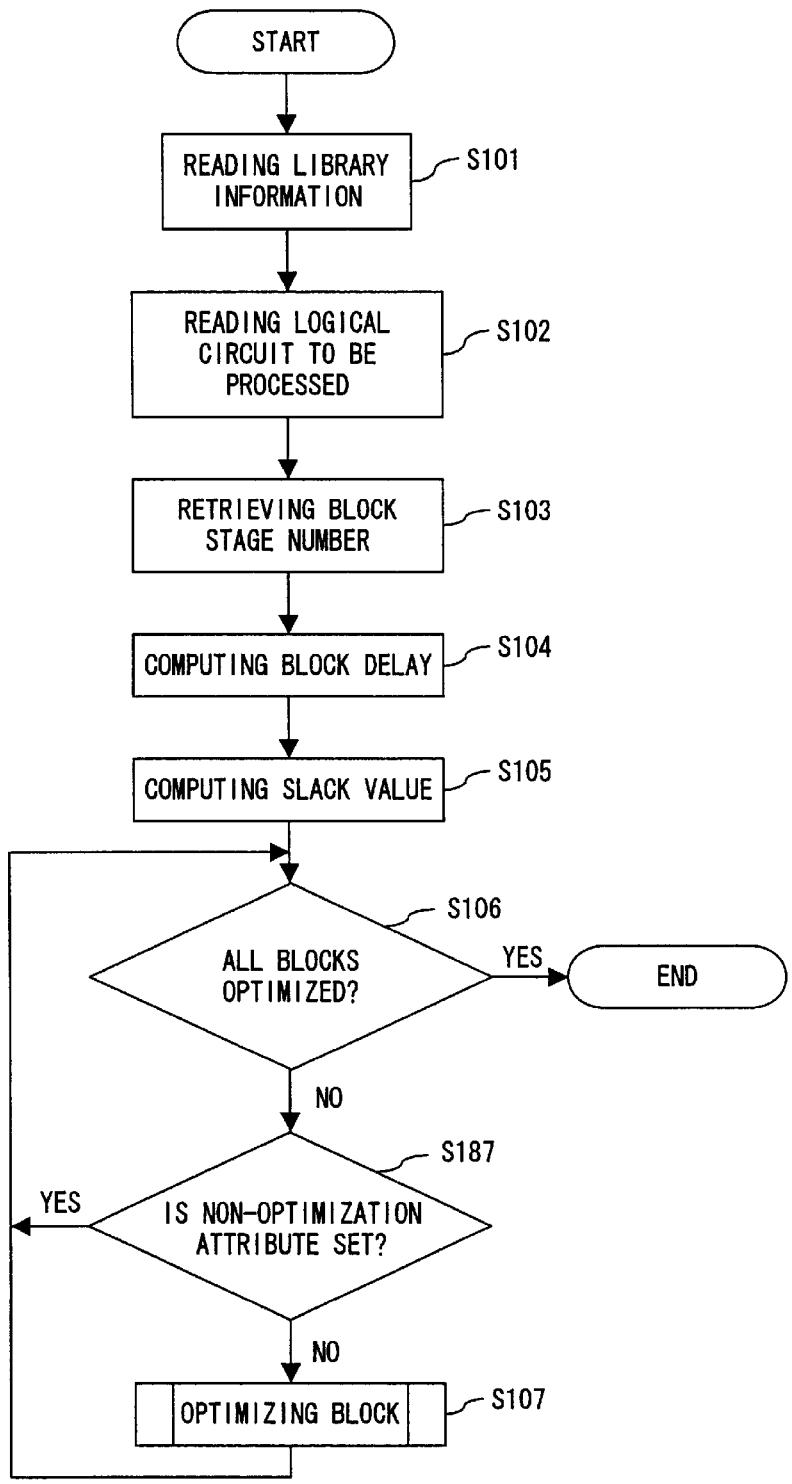
FIG. 21 shows a change made when a block non-optimization specification is issued in the circuit optimizing process shown in FIG. 3.

When the above mentioned block non-optimization specification detecting process in FIG. 3 is performed, the contents of the circuit delay optimizing process is changed as shown in FIG. 21.

As clearly shown in FIG. 21, the change is the determining process inserted between the process in S106 and the process in S107 shown in FIG. 3 as a process in S187 as to whether or not the non-optimization attribute has been set in the block to be optimized. After the change, only when the determination result is Yes, the block optimizing process in S107 is performed.

Described below is a practical example of suppressing the optimization on a part of blocks in the logical circuit to be optimized by performing the above mentioned processes by the CPU 101.

In the above mentioned circuit network B shown in FIG. 15, for example, if the block D is externally specified as a non-optimization block, the block D is assigned an attribute of non-optimization. At this time, the driving ability of the block D-a is added as a load capacity in the block A, but the branch block for the block A does not include the block D, but includes the blocks C and E. That is, the optimizing process is not performed on the block D.

Figure 22:
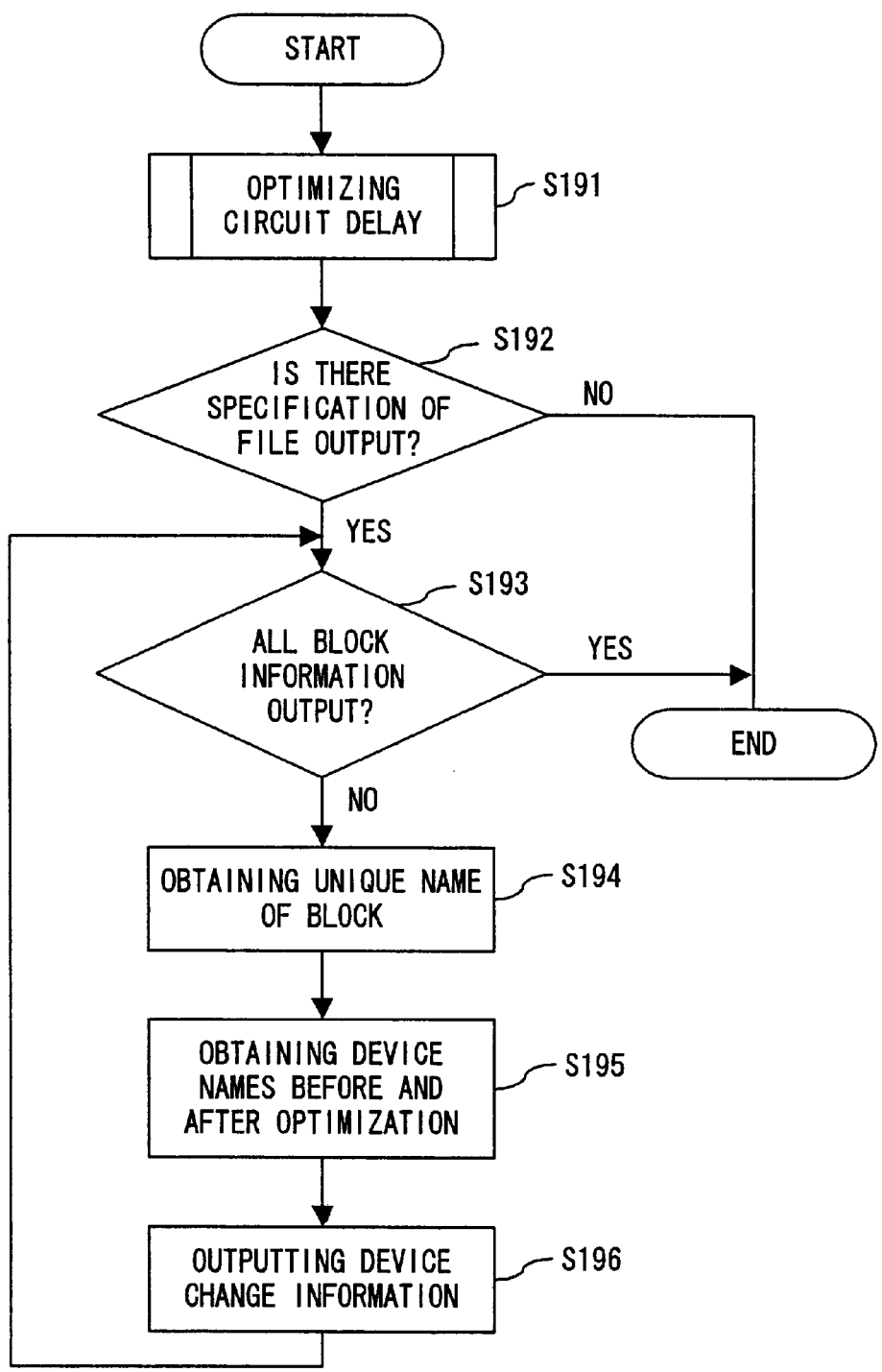
FIG. 22 is a flowchart of the contents of the device change information outputting process.

Described below is the process in FIG. 22. FIG. 22 is a flowchart showing the contents of the device change information outputting process. This process is performed to present the user with the contents of a change when the change is made to the device used in the circuit delay optimization, and is performed to improve the operation efficiency in the operation of the later installation design, etc. by clearly informing the user of the contents of the change.

The device change information outputting process is performed after the above mentioned circuit delay optimizing process shown in FIG. 3 as a process in S191.

In S192 after S191, it is determined whether or not an instruction to output a change information file storing the change information about available devices has been issued by the user to the input unit 105. If the determination result is Yes, then control is passed to S193. On the other hand, if the determination result is No, then the device change information outputting process immediately terminates.

In S193, it is determined whether or not the processes in S194 through S196 described later have been performed on all blocks in the logical circuit to be delay-optimized. If the determination result is Yes, the device change information outputting process terminates. If the determination result is No, control is passed to S194.

In S194, the name (unique name) assigned to the block to be processed is obtained. In S195, the device name of the device specified to be used before the optimization in the block, and the device name of the device to be used by the optimization in the block are obtained.

In S196, the unique name and the device name respectively obtained in the above mentioned processes in S194 and S195 are associated and stored in a change information file. Then, control is returned to S193, and the above mentioned processes are repeated.

Described below is a practical example of outputting the change information about a device to be used by the CPU 101 performing the process shown in FIG. 22.

It is assumed that the devices are replaced as listed in the table below for the circuit network B shown in FIG. 15 as a result of the above mentioned circuit delay optimizing process.

TABLE 6

| | DEVICE NAME | DRIVING ABILITY | OPTIMUM DRIVING ABILITY | REPLACING DEVICE NAME |
|---|---|---|---|---|
| BLOCK A | INV4 | 19.0 | 22.0 | INV5 |
| BLOCK B | INV1 | 10.0 | 12.6 | INV2 |
| BLOCK C | INV2 | 13.0 | 16.0 | INV3 |
| BLOCK D | 2NAND4 | 19.0 | 18.8 | 2NAND4 |
| BLOCK E | 2NOR3 | 16.0 | 14.5 | 2NOR2 |
| BLOCK F | INV3 | 16.0 | 11.2 | INV1 |

In the process in S196 shown in FIG. 22, the information shown in the table above is stored in the change information file as an output, for example, in the following format.

Change block A: INV 4, INV 5;

Change block B: INV 1, INV 2;

Change block C: INV 2, INV 3;

Change block D: 2 NAND 4, 2 NAND 4;

Change block E: 2 NOR 3, 2 NOR 2;

Change Block F: INV 3, INV 1;

To embody the present invention by a standard computer, a control program for directing a computer to execute the similar process performed by the CPU 101 of the present apparatus according to the above mentioned embodiments of the present invention is generated, and the control program is read and executed by the computer.

Furthermore, the control program can be recorded in a computer-readable storage medium, and the program can be read and executed from the storage medium to the computer, thereby embodying the present invention by the computer.

FIG. 23 shows an example of a storage medium recording a control program readable by a computer. As shown in FIG. 23, a storage medium can be, for example, memory 202 such as ROM, a hard disc, etc. provided as an internal or an external accessory device to a computer 201, or a portable storage medium 203, etc. such as a flexible disk, MO (magneto-optical disk), CD-ROM, DVD-ROM, etc. Furthermore, the storage medium can also be a storage device 206 provided for a computer functioning as a program server 205. In this case, a transmission signal obtained by modulating a carrier wave by a data signal representing the control program is transmitted from the program server 205 through the line 204 which is a transmission medium, and the computer 201 demodulates the received transmission signal and regenerates the control program, thereby executing the control program.

As described above, when the present invention optimizes a delay of a signal traveling in a logical circuit configured by connecting a plurality of circuit blocks by changing the specification about a primitive device specified for each circuit block for use in configuring the circuit blocks into the specification about another primitive device having the same function and a different driving ability value, it computes a driving ability value required for a target circuit block based on the delay rate of the circuit block indicating the rate of the delay of a signal traveling in the circuit block by the load capacity value provided for the circuit block, the driving ability value of a prior stage circuit block determined by the device specified as the prior stage circuit block connected at a stage prior to a target circuit block for which the specification is changed, and the load capacity value provided for the target circuit block by connecting another circuit block at a stage subsequent to the target circuit block, and changes the specification of the device used in the target circuit block based on the driving ability value obtained in the computation.

Thus, the optimum device to be used in a target circuit block can be selected based on the characteristic value of the circuit block connected at a stage prior to or subsequent to the target circuit block. As a result, the delay optimization can be realized for the logical circuit without extracting a critical path by selecting the optimum devices for all circuit blocks, thereby reducing the number of processes required for the delay optimization.

Otherwise, the present invention computes a slack value of a circuit block, distributes to each subsequent stage circuit block a driving ability value for each subsequent stage circuit block before changing the specification determined by a device specified as the subsequent stage circuit block when an output of a circuit block in a logical circuit is connected to one of a plurality of subsequent stage circuit blocks which are provided at the subsequent stages of the circuit block based on differences among the slack values computed for the subsequent stage circuit blocks with a sum of the driving ability values of the subsequent stage circuit blocks maintained, computes a driving ability value required for the subsequent stage circuit block by assuming that the distributed driving ability value distributed to each subsequent circuit block as a driving ability value of a circuit block provided at a stage prior to the subsequent stage circuit block, and changes the specification of a device for use in the subsequent stage circuit block based on the driving ability value obtained in the computation.

Thus, assigning a larger driving ability value to a subsequent stage circuit block having a shorter timing value and a smaller driving ability value to a subsequent stage circuit block having a longer timing value according to the slack value of each circuit block, the optimizing process can be performed with a signal path having a longer signal delay prioritized, thereby realizing delay optimization indicating well balanced driving abilities.

Otherwise, the present invention computes a slack value of a circuit block, computes the ratio of the sum of the driving ability values of subsequent stage circuit blocks before changing the specification determined by a device specified as the subsequent stage circuit block to a driving ability value of a circuit block having a smallest timing value according to a slack value in the subsequent stage circuit blocks before changing the specification when an output of a circuit block in a logical circuit is connected to one of a plurality of subsequent stage circuit blocks which are provided at the subsequent stages of the circuit block, computes a driving ability value required for the subsequent stage circuit block indicated as having the smallest timing value according to a slack value based on the ratio, and changes the specification of the subsequent stage circuit block indicated as having the smallest timing value according to a slack value based on the driving ability value obtained in the computation.

Thus, when the specification of a device as a subsequent stage circuit block indicated as having the smallest timing value by a slack value when subsequent stage circuit blocks configure a plurality of fanouts is changed, the characteristic value of another subsequent stage circuit block simultaneously driven with the subsequent stage circuit block is considered. Therefore, the device can be appropriately selected.

As described above, a circuit delay in a logical circuit can be optimized according to any aspect of the present invention.

What is claimed is:

1. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:

a driving ability value computation unit computing a driving ability value required for each target circuit block based on a delay rate of the circuit block indicating a rate of the delay of a signal traveling in the circuit block by a load capacity value provided for the circuit block, a driving ability value of a prior stage circuit block determined by the device specified for a prior stage circuit block connected at a stage prior to a target circuit block for which the specification is changed, and a load capacity value provided for the target circuit block by connecting another circuit block at a stage subsequent to the target circuit block; and a change unit changing the specification of the device used in the target circuit block based on the driving ability value obtained in the computation.

2. The system according to claim 1, wherein said change unit makes the change to select the device requiring the same installation circuit area as the device selected before the change.

3. The system according to claim 1, further comprising:

a delay value computation unit computing a delay value which can be generated by a signal input into the logical circuit or a signal output from a circuit block which is a flipflop in the logical circuit by a time it passes through and output from the prior stage circuit blocks for the target circuit block as delay values up to the prior stage circuit blocks; and a representative pin determination unit determining an input pin, in a plurality of input pins for input of a signal into the target circuit block, connected to one of the prior stage circuit blocks having a largest delay value up to the prior stage circuit blocks for the target circuit block as a representative pin for the circuit block for which the specification is changed, wherein said driving ability value computation unit can perform the computation based on the driving ability value of the circuit block connected to the representative pin in the prior stage circuit block for the target circuit block.

4. The system according to claim 1, further comprising:

an external device driving ability value input unit inputting a driving ability value of a device connected to the external input terminal of the logical circuit, wherein said driving ability value computation unit can compute a driving ability value required for the target circuit block connected to the external input terminal by assuming that a driving ability value input into the external device driving ability value input unit is a driving ability value of the prior stage circuit block.

5. The system according to claim 1, further comprising a prior stage circuit block driving ability value input unit inputting a driving ability value of the prior stage circuit block, wherein said driving ability value computation unit can compute a driving ability value required for the target circuit block by assuming that a driving ability value input into the prior stage circuit block driving ability value input unit is a driving ability value of the prior stage circuit block.

6. The system according to claim 1, further comprising
an external device load capacity value input unit inputting a load capacity value assigned to the logical circuit by a device connected to an external output terminal of the logical circuit, wherein
said driving ability value computation unit can compute a driving ability value required for the target circuit block connected to the external output terminal by assuming that a load capacity value input into said external device load capacity value input unit is a load capacity value assigned to the target circuit block.

7. The system according to claim 1, further comprising
a wiring capacity obtaining unit obtaining wiring capacity generated by wiring between the circuit blocks obtained by installation design of the logical circuit, wherein
said driving ability value computation unit can compute a driving ability value required for the target circuit block based on both the wiring capacity obtained by said wiring capacity obtaining unit and the load capacity value.

8. The system according to claim 1, further comprising
a non-optimization attribute assignment unit assigning to the circuit block an attribute indicating that the specification is not changed, wherein
said change unit cannot change the specification of the target circuit block to which the attribute is assigned by said non-optimization attribute assignment unit.

9. The system according to claim 1, further comprising
a change contents output unit outputting contents of the change in the target circuit block whose specification has been changed by said change unit.

10. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
a slack value computation unit computing a slack value of each circuit block;
a driving ability value distribution unit distributing to each subsequent stage circuit block a driving ability value for each subsequent stage circuit block before changing the specification determined by the device specified for the subsequent stage circuit block when an output of a circuit block in the logical circuit is connected to one of a plurality of subsequent stage circuit blocks which are provided at the subsequent stages of the circuit block based on differences among the slack values computed for the subsequent stage circuit blocks with a sum of driving ability values of the subsequent stage circuit blocks maintained;
a subsequent stage circuit block driving ability value computation unit computing a driving ability value required for the subsequent stage circuit block by assuming that a driving ability value distributed by said driving ability value distribution unit as a driving ability value of a circuit block provided at a stage prior to the subsequent stage circuit block; and
a subsequent stage circuit block change unit changing a specification of the device for use in the subsequent stage circuit block based on the driving ability value obtained in the computation.

11. The system according to claim 10, further comprising
a wiring capacity obtaining unit obtaining a wiring capacity generated by the wiring between the circuit blocks obtained by the installation design of the logical circuit, wherein
said subsequent stage circuit block driving ability value computation unit can perform the computation based on the wiring capacity obtained by said wiring capacity obtaining unit.

12. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
a slack value computation unit computing a slack value of the circuit block;
a driving ability ratio computation unit computing the ratio of the sum of the driving ability values of subsequent stage circuit blocks before changing the specification determined by the device specified for the subsequent stage circuit block to a driving ability value of a circuit block having a smaller timing value according to a slack value in the subsequent stage circuit blocks before changing the specification when an output of a circuit block in the logical circuit is connected to one of a plurality of subsequent stage circuit blocks which are provided at the subsequent stages of the circuit block;
a first driving ability value computation unit computing a driving ability value required for the subsequent stage circuit block indicated as having the smallest timing value according to a slack value based on the rate of the driving ability value computed by said driving ability ratio computation unit; and
a first subsequent stage circuit block change unit changing the specification of the subsequent stage circuit block indicated as having a smallest timing value according to a slack value based on the driving ability value obtained in the computation.

13. The system according to claim 12, further comprising:
a change rate computation unit computing a change rate of driving ability values based on driving ability value before the specification change of the circuit block having a lowest timing allowance level based on a slack value in the subsequent stage circuit blocks, and a driving ability value of the device specified after the change by said first subsequent stage circuit block change unit;
a second driving ability value computation unit computing based on the change rate a driving ability value required for other subsequent stage circuit blocks excluding the circuit block having a lowest timing allowance level based on a slack value in the subsequent stage circuit blocks;
a second subsequent stage circuit block change unit changing based on the driving ability value computed by said second driving ability value computation unit the specification for other subsequent stage circuit blocks excluding a circuit block having the lowest allowance level based on the slack value in the subsequent stage circuit blocks.

14. The system according to claim 12, further comprising
a wiring capacity obtaining unit obtaining a wiring capacity generated by the wiring between the circuit blocks obtained by the installation design of the logical circuit, wherein
said first driving ability value computation unit can compute a driving ability value required for the subsequent stage circuit block having a lowest timing allowance based on the slack value in the subsequent stage circuit blocks according to the wiring capacity obtained by said wiring capacity obtaining unit.

15. The system according to claim 12, further comprising
a wiring capacity obtaining unit obtaining a wiring capacity generated by the wiring between the circuit blocks obtained by the installation design of the logical circuit, wherein:
said first driving ability value computation unit can compute a driving ability value required for the subsequent stage circuit block having a lowest timing allowance based on the slack value in the subsequent stage circuit blocks according to the wiring capacity obtained by said wiring capacity obtaining unit; and
said second driving ability value computation unit can compute a driving ability value required for other subsequent stage circuit blocks excluding the block having a lowest timing allowance based on the slack value in the subsequent stage circuit blocks according to the wiring capacity obtained by said wiring capacity obtaining unit.

16. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
driving ability value computation means for computing a driving ability value required for each target circuit block based on a delay rate of the circuit block indicating a rate of the delay of a signal traveling in the circuit block by a load capacity value provided for the circuit block, a driving ability value of a prior stage circuit block determined by the device specified for a prior stage circuit block connected at a stage prior to a target circuit block for which the specification is changed, and a load capacity value provided for the target circuit block by connecting another circuit block at a stage subsequent to the target circuit block; and
change means for changing the specification of the device used in the target circuit block based on the driving ability value obtained in the computation.

17. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
slack value computation means for computing a slack value of each circuit block;
driving ability value distribution means for distributing to each subsequent stage circuit block a driving ability value for each subsequent stage circuit block before changing the specification determined by the device specified for the subsequent stage circuit block when an output of a circuit block in the logical circuit is connected to one of a plurality of subsequent stage circuit blocks which are provided at the subsequent stages of the circuit block based on differences among the slack values computed for the subsequent stage circuit blocks with a sum of driving ability values of the subsequent stage circuit blocks maintained;
first subsequent stage circuit block driving ability value computation means for computing a driving ability value required for the subsequent stage circuit block by assuming that a driving ability value distributed by said driving ability value distribution means as a driving ability value of a circuit block provided at a stage prior to the subsequent stage circuit block; and
first subsequent stage circuit block change means for changing a specification of the device for use in the subsequent stage circuit block based on the driving ability value obtained in the computation.

18. An optimization system which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
slack value computation means for computing a slack value of the circuit block;
driving ability ratio computation means for computing the ratio of the sum of the driving ability values of subsequent stage circuit blocks before changing the specification determined by the device specified for the subsequent stage circuit block to a driving ability value of a circuit block having a smaller timing value according to a slack value in the subsequent stage circuit blocks before changing the specification when an output of a circuit block in the logical circuit is connected to one of a plurality of subsequent stage circuit blocks which are provided at the subsequent stages of the circuit block;
first driving ability value computation means for computing a driving ability value required for the subsequent stage circuit block indicated as having the smallest timing value according to a slack value based on the rate of the driving ability value computed by said driving ability ratio computation means; and
first subsequent stage circuit block change means for changing the specification of the subsequent stage circuit block indicated as having a smallest timing value according to a slack value based on the driving ability value obtained in the computation.

19. An optimizing method which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:
computing a driving ability value required for each target circuit block based on a delay rate of the circuit block indicating a rate of the delay of a signal traveling in the circuit block by a load capacity value provided for the circuit block, a driving ability value of a prior stage circuit block determined by the device specified for a prior stage circuit block connected at a stage prior to a target circuit block for which the specification is changed, and a load capacity value provided for the target circuit block by connecting another circuit block at a stage subsequent to the target circuit block; and changing the specification of the device used in the target circuit block based on the driving ability value obtained in the computation.

20. An optimizing method which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising:

computing a slack value of each circuit block;

distributing to each subsequent stage circuit block a driving ability value for each subsequent stage circuit block before changing the specification determined by the device specified for the subsequent stage circuit block when an output of a circuit block in the logical circuit is connected to one of a plurality of subsequent stage circuit blocks which are provided at the subsequent stages of the circuit block based on differences among the slack values computed for the subsequent stage circuit blocks with a sum of driving ability values of the subsequent stage circuit blocks maintained;

computing a driving ability value required for the subsequent stage circuit block by assuming that the distributed driving ability value as a driving ability value of a circuit block provided at a stage prior to the subsequent stage circuit block; and changing a specification of the device for use in the subsequent stage circuit block based on the driving ability value obtained in the computation.

21. An optimizing method which optimizes a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, comprising the steps of:

computing a slack value of the circuit block;

computing the ratio of the sum of the driving ability values of subsequent stage circuit blocks before changing the specification determined by the device specified for the subsequent stage circuit block to a driving ability value of a circuit block having a smaller timing value according to a slack value in the subsequent stage circuit blocks before changing the specification when an output of a circuit block in the logical circuit is connected to one of a plurality of subsequent stage circuit blocks which are provided at the subsequent stages of the circuit block;

computing a driving ability value required for the subsequent stage circuit block indicated as having the smallest timing value according to a slack value based on the rate of the computed driving ability value; and changing the specification of the subsequent stage circuit block indicated as having a smallest timing value according to a slack value based on the driving ability value obtained in the computation.

22. A computer-readable storage medium storing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, by performing a process comprising:

computing a driving ability value required for each target circuit block based on a delay rate of the circuit block indicating a rate of the delay of a signal traveling in the circuit block by a load capacity value provided for the circuit block, a driving ability value of a prior stage circuit block determined by the device specified for a prior stage circuit block connected at a stage prior to a target circuit block for which the specification is changed, and a load capacity value provided for the target circuit block by connecting another circuit block at a stage subsequent to the target circuit block; and changing the specification of the device used in the target circuit block based on the driving ability value obtained in the computation.

23. A computer-readable storage medium storing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, said program comprising the process of:

computing a slack value of each circuit block;

distributing to each subsequent stage circuit block a driving ability value for each subsequent stage circuit block before changing the specification determined by the device specified for the subsequent stage circuit block when an output of a circuit block in the logical circuit is connected to one of a plurality of subsequent stage circuit blocks which are provided at the subsequent stages of the circuit block based on differences among the slack values computed for the subsequent stage circuit blocks with a sum of driving ability values of the subsequent stage circuit blocks maintained;

computing a driving ability value required for the subsequent stage circuit block by assuming that the distributed driving ability value as a driving ability value of a circuit block provided at a stage prior to the subsequent stage circuit block; and changing a specification of the device for use in the subsequent stage circuit block based on the driving ability value obtained in the computation.

24. A computer-readable storage medium storing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, said program comprising the processes of:

computing a slack value of the circuit block;

computing the ratio of the sum of the driving ability values of subsequent stage circuit blocks before changing the specification determined by the device specified for the subsequent stage circuit block to a driving ability value of a circuit block having a smaller timing value according to a slack value in the subsequent stage circuit blocks before changing the specification when an output of a circuit block in the logical circuit is connected to one of a plurality of subsequent stage circuit blocks which are provided at the subsequent stages of the circuit block;

computing a driving ability value required for the subsequent stage circuit block indicated as having the smallest timing value according to a slack value based on the rate of the computed driving ability value; and changing the specification of the subsequent stage circuit block indicated as having a smallest timing value according to a slack value based on the driving ability value obtained in the computation.

25. A computer data signal embodied in a carrier wave and representing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, said program comprising the processes of:

computing a driving ability value required for each target circuit block based on a delay rate of the circuit block indicating a rate of the delay of a signal traveling in the circuit block by a load capacity value provided for the circuit block, a driving ability value of a prior stage circuit block determined by the device specified for a prior stage circuit block connected at a stage prior to a target circuit block for which the specification is changed, and a load capacity value provided for the target circuit block by connecting another circuit block at a stage subsequent to the target circuit block; and changing the specification of the device used in the target circuit block based on the driving ability value obtained in the computation.

26. A computer data signal embodied in a carrier wave and representing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, said program comprising the process of:

computing a slack value of each circuit block;

distributing to each subsequent stage circuit block a driving ability value for each subsequent stage circuit block before changing the specification determined by the device specified for the subsequent stage circuit block when an output of a circuit block in the logical circuit is connected to one of a plurality of subsequent stage circuit blocks which are provided at the subsequent stages of the circuit block based on differences among the slack values computed for the subsequent stage circuit blocks with a sum of driving ability values of the subsequent stage circuit blocks maintained;

computing a driving ability value required for the subsequent stage circuit block by assuming that the distributed driving ability value as a driving ability value of a circuit block provided at a stage prior to the subsequent stage circuit block; and changing a specification of the device for use in the subsequent stage circuit block based on the driving ability value obtained in the computation.

27. A computer data signal embodied in a carrier wave and representing a program used to direct a computer to perform optimization on a delay of a signal traveling in a logical circuit configured by connecting a plurality of circuit blocks by changing a specification about a primitive device specified for each circuit block for use in configuring the circuit blocks into a specification about another primitive device having the same function and a different driving ability value, said program comprising the processes of:

computing a slack value of the circuit block;

computing the ratio of the sum of the driving ability values of subsequent stage circuit blocks before changing the specification determined by the device specified for the subsequent stage circuit block to a driving ability value of a circuit block having a smaller timing value according to a slack value in the subsequent stage circuit blocks before changing the specification when an output of a circuit block in the logical circuit is connected to one of a plurality of subsequent stage circuit blocks which are provided at the subsequent stages of the circuit block;

computing a driving ability value required for the subsequent stage circuit block indicated as having the smallest timing value according to a slack value based on the rate of the computed driving ability value; and changing the specification of the subsequent stage circuit block indicated as having a smallest timing value according to a slack value based on the driving ability value obtained in the computation.

* * * * *